United States Patent [19]

Tatoh

[11] Patent Number: 5,296,698
[45] Date of Patent: Mar. 22, 1994

[54] LATERAL PHOTO-SENSING DEVICE, OPT-ELECTRONIC INTEGRATED CIRCUIT USING THE LATERAL PHOTO-SENSING DEVICE AND PHOTO-LOGIC DEVICE USING THE LATERAL PHOTO-SENSING DEVICE

[75] Inventor: Nobuyoshi Tatoh, Yokohama, Japan

[73] Assignee: Sumitomo Electric Industries, Ltd., Osaka, Japan

[21] Appl. No.: 840,899

[22] Filed: Feb. 26, 1992

[30] Foreign Application Priority Data

Feb. 28, 1991 [JP] Japan .................................. 3-34046
Apr. 17, 1991 [JP] Japan .................................. 3-85311
Jul. 2, 1991 [JP] Japan .................................. 3-161769
Jul. 2, 1991 [JP] Japan .................................. 3-161800

[51] Int. Cl.$^5$ ...................... H01L 49/00; H01L 27/00
[52] U.S. Cl. .................................. 250/214.1; 257/499
[58] Field of Search ............. 250/214.1, 214 R, 208.1; 257/449, 466; 307/311

[56] References Cited

U.S. PATENT DOCUMENTS 4,811,069 3/1989 Kakinuma et al. ............. 257/449 X
4,962,303 10/1990 Chu ................................. 257/449 X

OTHER PUBLICATIONS

Patent Abstracts of Japan, vol. 10, No. 309 (E-447) (2365) Oct. 21, 1986 & JP-A-61 121 482 (NEC) Jun. 9, 1986.
J. B. D. Soole et al, "Transmit-Time Limited Frequency Response of InGaAs MSM Photodetectors", *IEEE Transactions of Electron Devices*, vol. 37, No. 11, New York, U.S., pp. 2285-2291 (Nov. 1990).
O. Wada et al, "Very High Speed GaInAs Metal-Semiconductor-Metal Photodiode Incorporating an AlInAs/GaInAs Graded Superlattice", *Applied Physics Letters*, vol. 54, No. 1, New York, U.S., pp. 16-17 (Jan. 2, 1989).
L. Yang et al, "Monolithically Integrated InGaAs/InP MSM-FET Photo-Receiver Prepared by Chemical Beam Epitaxy", *Journal of Crystal Growth*, vol. 105, No. 1, Amsterdam NL, pp. 162-167 (Oct. 1990).
"Photo-Gate DET", *IBM Technical Disclosure Bulletin*, vol. 32, No. 1, New York, U.S., p. 34 (Jun. 1989).
O. R. Gupta et al, "Fiber-Optic Flip-Flop", *IBM Technical Disclosure Bulletin*, vol. 25, No. 7B, New York, U.S., pp. 3887-3888 (Dec. 1982).
K. Okumura et al, "Optical Logic Inverter and AND Elements Using Laser or Light-Emitting Diodes and Photodetectors in a Bistable System", *Optics Letters*, vol. 9, No. 11, New York, U.S., pp. 519-521 (Nov. 1984).

*Primary Examiner*—David C. Nelms
*Assistant Examiner*—John R. Lee
*Attorney, Agent, or Firm*—Beveridge, DeGrandi, Weilacher & Young

[57] ABSTRACT

The present invention is directed to a lateral photo-sensing device comprising a first semiconductor layer of a first conductivity type formed on a semi-insulative semiconductor substrate, a second semiconductor layer of a second conductivity type formed on the first semiconductor layer for absorbing a light, a pair of electrodes formed on the second semiconductor layer, rectifying junction being formed between the electrodes and the second semiconductor layer, and a biasing electrode for applying a biasing voltage to the first semiconductor layer. Further the present invention is directed to an opt-electronic integrated circuit using the lateral photo-sensing device and a photo-logic device using the lateral photo-sensing device.

16 Claims, 21 Drawing Sheets

LATERAL PHOTO-SENSING DEVICE, OPT-ELECTRONIC INTEGRATED CIRCUIT USING THE LATERAL PHOTO-SENSING DEVICE AND PHOTO-LOGIC DEVICE USING THE LATERAL PHOTO-SENSING DEVICE

BACKGROUND OF THE INVENTION

1. Field of the Invention

The present invention relates to a lateral photo-sensing device used for photo-electric conversion or photo-detection, an opt-electronic integrated circuit using the lateral photo-sensing device and a photo-logic device using the lateral photo-sensing device. Further the present invention more particularly relates to a photo-conductive type lateral photo-sensing device used for an opt-electronic integrated circuit (OEIC) or a photo-module for light communication or light information processing, to a opt-electronic integrated circuit (OEIC) used in an optical local area network (LAN) a fiber distributed data interface (FDDI) which has a limited operation band and operates at a high speed, to a photo-receiving OEIC applicable to both long distance and short distance light communications, and to an optical switch for light communication which is usable in a photo-logic operation in an opt-neuro system or an optical computer.

2. Related Background Art

FIGS. 1A, 1B and 1C show examples of prior art lateral photo-sensing devices.

In a first photo-conductive type photo-sensing device shown in FIG. 1A (Japanese Patent Application No. 63-88758), a recess is formed in a semi-insulative semiconductor substrate 5, and a p-type semiconductor layer 6 is formed therein and then an n-type photo-sensing layer 7 is formed. In this manner, a flat lateral photo-sensing device which is easy to isolate is provided. A pair of n-type ohmic electrodes 9a and 9b are formed on the photo-sensing layer 7 as photo-sensing device electrodes. A p-type ohmic electrode 8 formed and the semiconductor layer 6 functions to apply a reverse bias between the semiconductor layer 6 and the photo-sensing layer 7. Holes generated in the photo-sensing layer 7 are collected by the ohmic electrode 8 to improve an operation speed of the device. Further, the photo-sensing layer is depleted to reduce a dark current.

In a second photo-conductive type photo-sensing device shown in FIG. 1B (Japanese Patent Application No. 63-81030), an n-type photo-sensing layer 11 is first grown on a semi-insulative semiconductor substrate 12.

Then, a pair of n-type ohmic electrodes 13a and 13b and a pair of p-type ohmic electrodes 14a and 14b surrounding the electrodes 13a and 13b are formed on the photo-sensing layer 11. The electrodes 14a and 14b function to increase a resistance of a light absorbing layer beneath the electrodes 13a and 13b so that a dark current is reduced and a performance of the device is improved.

In a third photo-conductive type photo-sensing device shown in FIG. 1C (pp 1. Phys. Lett. 54(1), Jan. 2, 1989, pp 16-17), a light absorbing GaInAs layer 24 is formed on semi-insulative InP substrate 21 and AlInAs layer 22 with an intervention of a superlattice layer 23. Then, a barrier enhancing AlInAs layer 26 and a Schottky electrode Al layer 27 are formed on the GaInAs layer 24 with an intervention of a superlattice layer 25. It is then mesa-etched to form a device as shown. Because of the presence of the AlInAs layer 26, the device has a small dark current and exhibits a high response characteristic.

In the first and second photo-conductive type photo-sensing devices described above, the n-type ohmic electrodes are used as the device electrodes. As a result, the device has a relatively large dark current and a large noise and it is not suitable for use as the OEIC. Further, it is not suitable for a high speed operation because of reinfection of carriers.

On the other hand, in the third photo-conductive type photo-sensing device, a responsivity and a response speed are low at a low bias voltage (e.g. $-3v$). In order to attain sufficient sensitivity and response speed in such a device, a high bias voltage such as vi or higher is required.

Further FIG. 2 shows a conventional circuit configuration used in a prior art photo-sensing OEIC or photo-sensing module. A pin-photo-diode (PD), a metal-semiconductor-metal (MSM) or an avalanche photo-diode (APD) is used as a photo-sensing device 32 for converting a signal light to an electrical detection signal. In order to amplify the detection signal of the photo-sensing device 32, an amplifier circuit comprising an amplifier 34 and a load resistor 36 is connected succeeding to the photo-sensing device 32. While a trans-impedance type amplifier circuit may be connected the electrical signal may be mixed by other methods.

However, when the pin-PD or the MSM is used in the OEIC, a signal detection band is governed by a capacitance and a time constant of a load resistor, and a photo-sensing diameter must be small in order to attain a high operation speed. In such an OEIC, a responsivity does not exceed 1 A/W in principle and no substantial amplification effect is attained. Thus, the amplifier circuit is necessarily complex. In the OEIC which uses the APD, the drive voltage is several tens of volts, which makes it difficult to apply to the OEIC which is operated by a signal power supply. In the approach to mix the electrical signal, the circuit configuration is difficult to design and high integration density OEIC is difficult to attain.

Further more, fibers used for light communication include ones for short distance and ones for long distance. In the optical LAN, a module which is compatible to both applications is required. In general, the fiber for short distance supplies a strong light signal and a fiber for long distance supplies a weak light signal. Accordingly, an AGC function is required to cope with the signals from those fibers. Two prior art techniques to attain the AGC are known. In one approach, an external control circuit is provided to control a gain of a pre-amplifier. (For example, Japanese Patent Application No. 1-217967). In the other approach, this function is provided in the amplifier and the internal circuit produces an average level and varies a bias voltage of the amplifier in accordance with the average level.

However, in the approach to control the gain of the pre-amplifier, heat generation is not negligible, power consumption is high and noise is high. In the approach to change the bias voltage of the amplifier by the internal circuit of the amplifier, additional problems of complexity of circuit configuration and low yield of the manufacture of the OEIC arise.

Further prior art optical switches (a) use a two-dimensional planar wave guide formed on a LiNbO₃ surface or (b) convert a light signal to an electrical signal and process it by an associated electrical circuit.

One photo-logic device (c) directs parallel light signals of vector components to two orthogonal planes of a nonlinear optical material and takes out a secondary harmonic generated at a cross-point of the parallel light signals as a matrix of an optical AND signal. Further, an optical neuro chip used in the photo-operation (d) uses a mask having a transmissibility which is proportional to a synapus load sandwiched between a belt-shaped light emitting diode array and belt-shaped photo-sensing diode array (Optics Letters, Vol. 14, No. 16, Aug. 15, 1989), and an optical memory used for the optical operation (e) uses a parallelly connected pn structure (Optics Letters, Vol. 15, No. 13, Jul. 1, 1990).

However, in the optical switch of (a), the absorption in the $LiNbO_3$ wave guide is not negligible and a transmissive characteristic is not good. In the optical switch of (b), the structure is complex because the photo-sensing device, IC and light emitting device are integrated.

In the photo-logic device of (c), the output optical AND signal is weak because the nonlinear optical material is used and only two-dimensional processing is permitted. In the devices of (d) and (e), they are not photo-logic devices by themselves and their burden to the associated electrical circuit is large.

SUMMARY OF THE INVENTION

It is a first object of the present invention to provide a lateral photo-sensing device which operates at a high speed, has a high responsivity and is operable with a low bias voltage.

In order to achieve the above first object, the lateral photo-sensing device of the present invention comprises:

(a) a first semiconductor layer of a first conductivity type formed on a semi-insulative semiconductor substrate;

(b) a second semiconductor layer of a second conductivity type formed on the first semiconductor layer for absorbing a light;

(c) a pair of Schottky type electrodes formed on the second semiconductor layer; and (d) a biasing electrode for applying a biasing voltage to the first semiconductor layer.

In the lateral photo-sensing device of the present invention, the electrodes are formed on the light absorbing second semiconductor layer as the device electrodes, and a rectifying junction such as pn junction or Schottky junction, is formed between the electrodes and the light absorbing second semiconductor. As a result, the re-injection of the carriers is suppressed and a high speed operation is attained. Further, the biasing electrode is formed on the first semiconductor layer which is formed between the semi-insulative semiconductor substrate and the light absorbing second semiconductor layer. A positive or negative voltage is applied to the biasing electrode so that carriers of one type photo-generated in the second semiconductor layer are taken out of the biasing electrode to improve the operation speed of the device. On the other hand, when a reverse voltage is applied to the biasing electrode, the carriers of one type are confined in the second semiconductor layer so that the responsivity of the device is enhanced.

It is a second object of the present invention to provide an OEIC which operates at a high speed, has a high responsivity and operates with a low bias voltage.

In order to achieve the above second object, the OEIC or the present invention comprises: (a) a photo-conductive type lateral photo-sensing device including a first semiconductor layer of a first conductivity type formed on a semi-insulative semiconductor substrate, a second semiconductor layer of a second conductivity type formed on the first semiconductor layer for absorbing a light, a pair of electrodes formed on the second semiconductor layer, a rectifying junction being formed between the electrode and the second semiconductor layer and a biasing electrode formed on the first semiconductor layer; and (b) a control circuit for applying a control signal to bias the electrode in accordance with a detection signal from the lateral photo-sensing device to control an operation condition of the lateral photo-sensing device.

The OEIC of the present invention is provided with the photo-conductive type lateral photo-sensing device as described above. The lateral photo-sensing device has the pair of electrodes such as forming Schottky junction or pn junction, formed on the light absorbing second semiconductor layer, as the device electrodes. As a result, it can reduce a dark current to some extent and reduce a noise. Further, the re-injection of carriers is suppressed and a high speed operation is attained to some extent. However, these are not sufficient. Thus, the biasing electrode is formed on the first semiconductor substrate formed between the semi-insulative semiconductor substrate and the light absorbing second semiconductor layer. When a positive or negative voltage is applied to the biasing electrode, the carriers of both types, which are photo-generated in the second semiconductor layer, can be confined therein so that the detection output of the device is enhanced. However, a long tail appears in the detection signal of the light pulse and the high speed response is not attained. On the other hand, when a voltage of the opposite polarity is applied to the biasing electrode, the carriers of one type which are photo-generated in the second semiconductor layer can be taken out of the biasing electrode so that the detection output of the lateral photo-sensing device is reduced and a high speed response is attained. The OEIC of the present invention utilizes such features of the lateral photo-sensing device. Namely, the control circuit applies a control signal to apply a predetermined voltage to the biasing electrode to keep the lateral photo-sensing device in an operation condition to increase its detection output, and applies a control signal to apply another voltage to the biasing electrode in response to the detection signal of the light pulse from the lateral photo-sensing device to switch the operation condition of the lateral photo-sensing device to reduce its detection output. As a result, the long tail in the detection signal is eliminated and the high speed operation of the device in attained while the peak responsivity is maintained.

It is a third object of the present invention to provide a photo-receiving OEIC which has a low heat generation, a low power consumption and a low power consumption and a low noise.

In order to achieve the above third object, the OEIC of the present invention comprises, (a) a photo-conductive type lateral photo-sensing device including a first semiconductor layer of a first conductivity type formed on a semi-insulative semiconductor substrate, a second semiconductor layer of a second conductivity type formed on the first semiconductor layer for absorbing light, a pair of electrodes formed on the second semiconductor layer, and a biasing electrode formed on the first semiconductor layer; and (b) a control circuit for varying a bias voltage to be applied to the biasing electrode in accordance with a level of a detection signal from the lateral photo-sensing device.

In the OEIC of the present invention, a positive or negative voltage is applied to the biasing electrode so that carriers having a small mobility, of the carriers which are photo-generated in the second semiconductor layer, are confined therein and a responsivity of the device is enhanced. On the other hand, when a bias voltage of the opposite polarity is applied to the biasing electrode, the carriers having the small mobility which are photo-generated in the second semiconductor layer are efficiently taken out of the biasing electrode and the responsivity of the device is decreased. The OEIC of the present invention utilizes such a characteristic of the lateral photo-sensing device. Namely, the control circuit varies the bias voltage to be applied to the biassing electrode in accordance with the level of the detection signal from the lateral photo-sensing device so that the responsivity of the lateral photo-sensing device is feedback-controlled.

It is a fourth object of the present invention to provide a photo-logic device which is simple in structure, has a high efficiency and permits three-dimensional processing.

In order to achieve the above fourth object, the photo-logic device of the present invention comprises, (a) a photo-conductive type lateral photo-sensing device including a first semiconductor layer of a first conductivity type formed on a semi-insulative semiconductor substrate, a second semiconductor layer of a second conductivity type formed on the first semiconductor layer for absorbing a light, a pair of electrodes such as those forming created by a Schottky junction or pn junction between itself and the second semiconductor layer, formed on the second semiconductor layer and a biasing electrode formed on the first semiconductor layer; and (b) optical guide means for guiding at least two signal lights to the second semiconductor layer.

The optical guide means may be formed by an optical wave guide formed in the semiconductor substrate, or an optical wave guide formed off the semiconductor substrate. Further, the optical guide means may be formed by an optical component or a fiber coupler.

The photo-logic device of the present invention is provided with the photo-conductive type lateral photo-sensing device described above. A sensitivity (that is, a responsivity) of the lateral photo-sensing device decreases as a signal light intensity increases due to a space charge effect when the signal light intensity directed to the device exceeds a predetermined level. Accordingly, by setting the intensities of two or more signal lights directed to the lateral photo-sensing device through the optical guide means such that a maximum value of each of the intensities does not exceed the predetermined level and a sum of the maximum intensities exceeds the predetermined level, a photo-logic device having an exclusive OR (EXOR) logic operation to the signal lights applied to the lateral photo-sensing device is provided.

In the lateral photo-sensing device, the biasing electrode is formed on the first semiconductor layer formed between the semi-insulative semiconductor substrate and the light absorbing second semiconductor layer. When a positive or negative voltage is applied to the biasing electrode, carriers having a small mobility, of the carriers photo-generated in the second semiconductor layer are confined therein so that the sensitivity of the photo-sensing device is enhanced. On the other hand, when a voltage of opposite polarity is applied to the biasing electrode, the carriers having small mobility can be taken out of the biasing electrode so that the sensitivity of the photo-sensing device is lowered. By utilizing the characteristic of such a lateral photo-sensing device, a signal light intensity to cause the space charge effect can be controlled and the operation function such as EXOR to the signal lights applied to the lateral photo-sensing device can be released as required.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DESCRIPTION OF THE PREFERRED EMBODIMENT

Before the explanation of a specific embodiment, an example of the lateral photo-sensing device of the present invention and an operation thereof are explained.

Figure 1A:
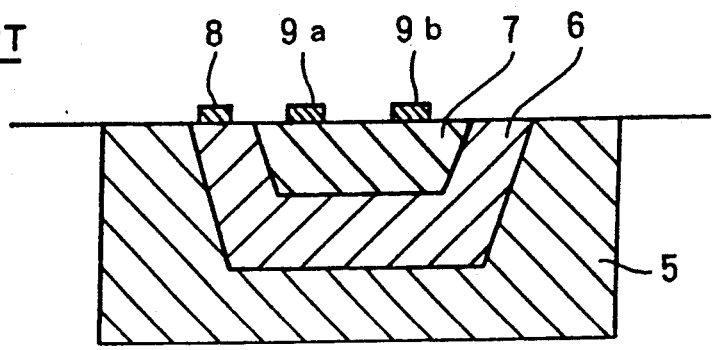
FIGS. 1A, 1B and 1C show sectional views of a prior art lateral photo-sensing device.
Figure 1B:
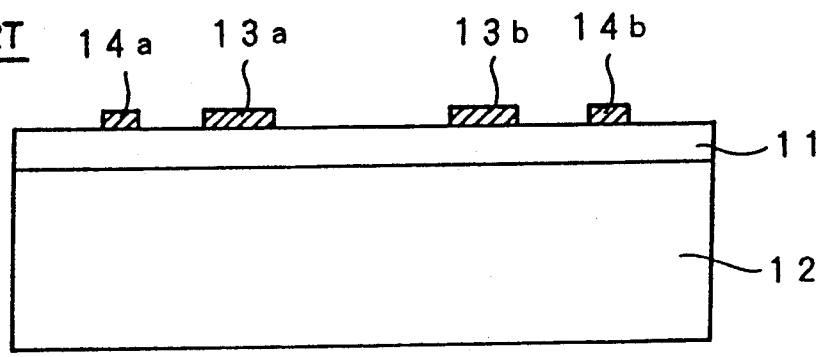
Figure 1C:
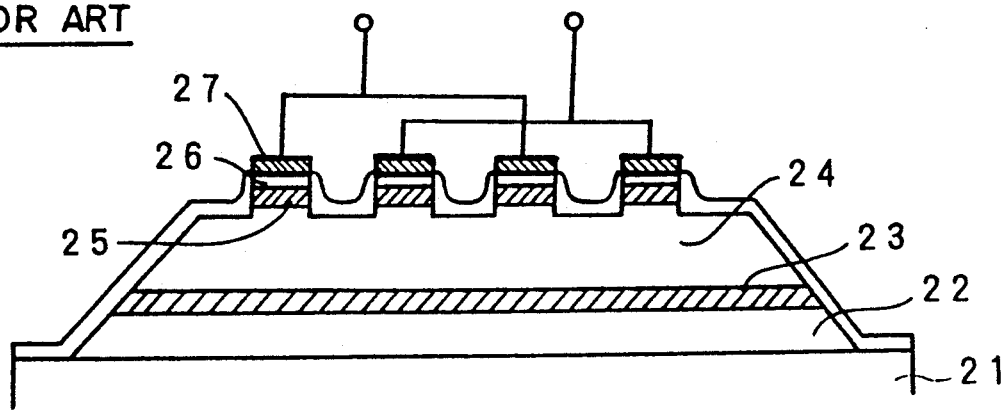
Figure 2:
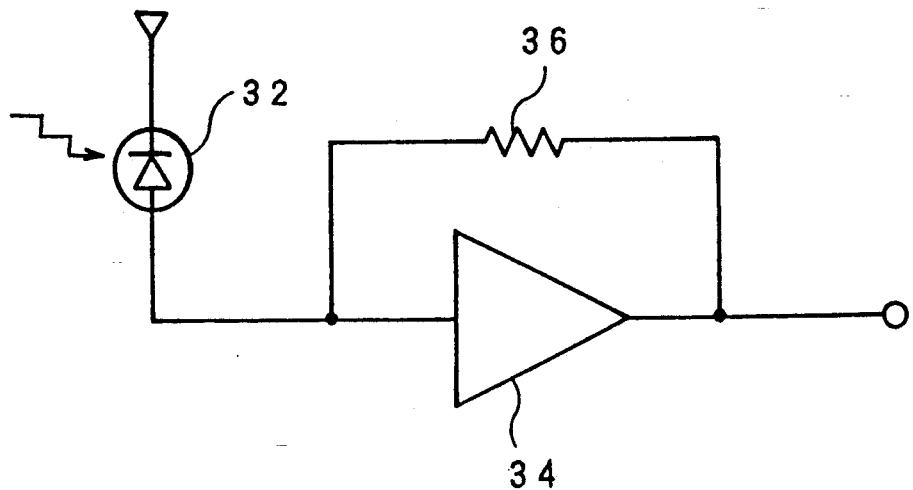
FIG. 2 shows a sectional view of a prior art opt-electronic integrated circuit.
Figure 3:
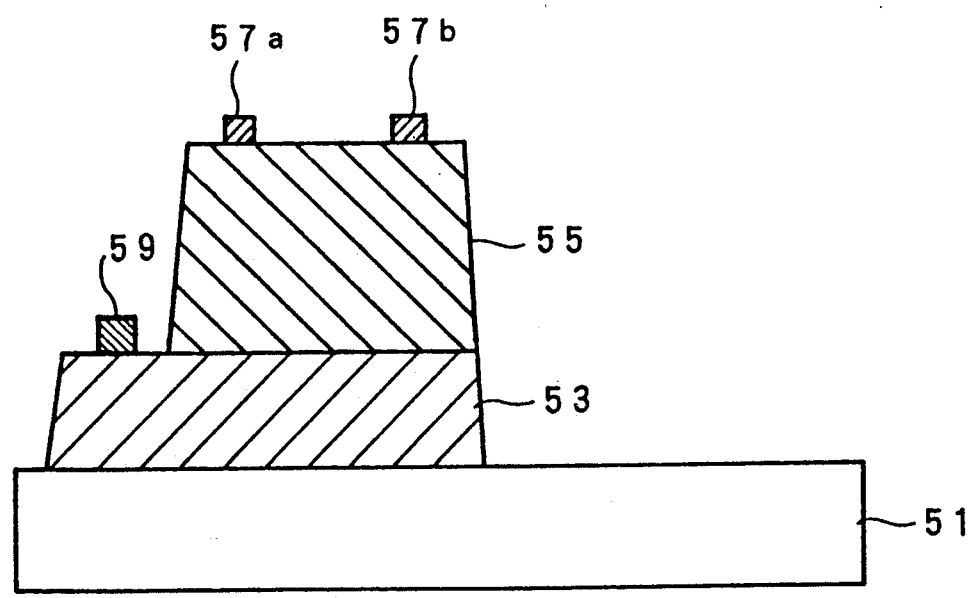
FIG. 3 shows a structure of a lateral photo-sensing device of the present invention.

FIG. 3 shows a structure of such a lateral photo-sensing device. As shown, a p-type InP layer 53 is crystal-grown on a semi-insulative InP substrate 51, and an InGaAs photo-sensing layer 55 is crystal-grown thereon. Then, a pair of Ti/Pt/Au Schottky electrodes 57a and 57b are formed on the InGaAs photo-sensing layer 55 to prevent injunction of electrons. A p-type ohmic electrode 59 is formed at an end of the InP layer 53 and a potential of the InP layer 53 is thus controlled.

Figure 4A:
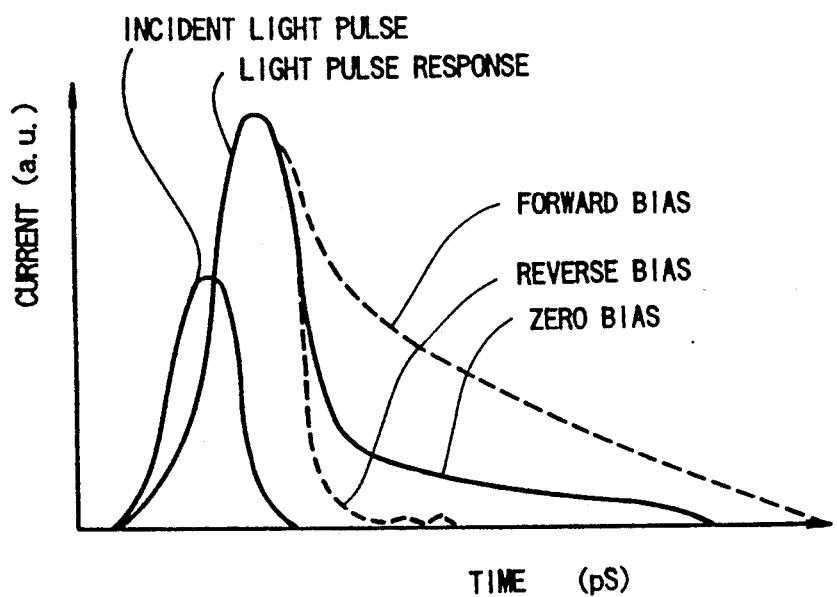
FIGS. 4A and 4B illustrate an operation of the lateral photo-sensing device of FIG. 3.
Figure 4B:
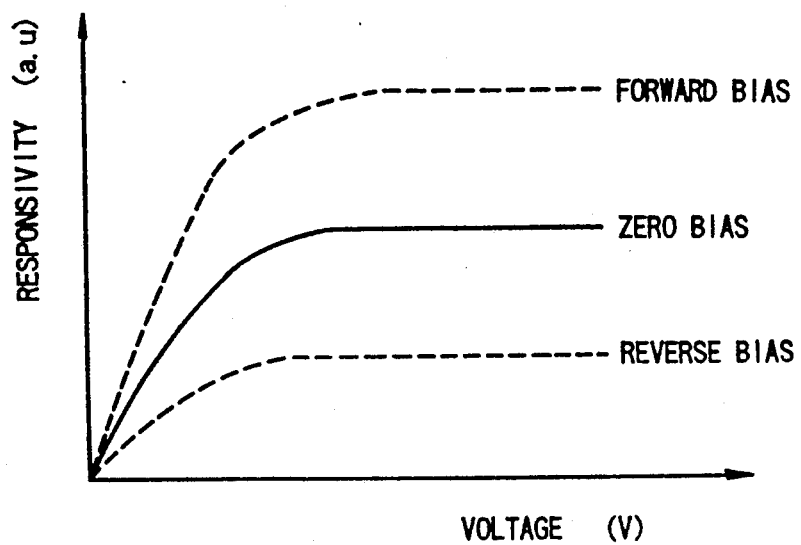

FIGS. 4A and 4B illustrate an operation of the lateral photo-sensing device of FIG. 3. When no voltage is applied (zero bias) to the p-type ohmic electrode 59 formed at the end of the p-type InP layer 53, a resistance between the Schottky electrodes 57a and 57b is reduced by the carriers which are photo-generated in the photo-sensing layer 55 by an incident light pulse so that a current which depends on the bias voltage applied between the electrodes 57a and 57b may be taken out. In this case, however, a long tail appears (a solid line in FIG. 4A) in a light pulse response due to the presence of minority carriers such as holes. When a negative voltage (a reverse bias) is applied to the ohmic electrode 59, holes of the carriers which are photo-generated in the photo-sensing layer 55 by the incident light pulse are absorbed by the InP layer 53 and collected to the ohmic electrode 59. As a result, the operation speed of the lateral photo-sensing device is improved (a broken line in FIG. 4A). In this case, since the InP layer 53 is of p-type, holes having a smaller mobility than that of electrons can be taken out of the photo-sensing layer 55 so that the response speed of the lateral photo-sensing device is further improved. On the other hand, when a positive voltage (a forward bias) is applied to the ohmic electrode 59, the photo-generated holes are not absorbed by the InP layer 53 but left in the photo-sensing layer 55. As a result, the responsivity of the lateral photo-sensing device is improved (a broken line in FIG. 4B). In this manner, the control of the speed and the responsivity which has not been attainable in the prior art lateral photo-sensing device is attained by controlling the voltage applied to the ohmic electrode.

Specific embodiments of the present invention are now explained.

Figure 5A:
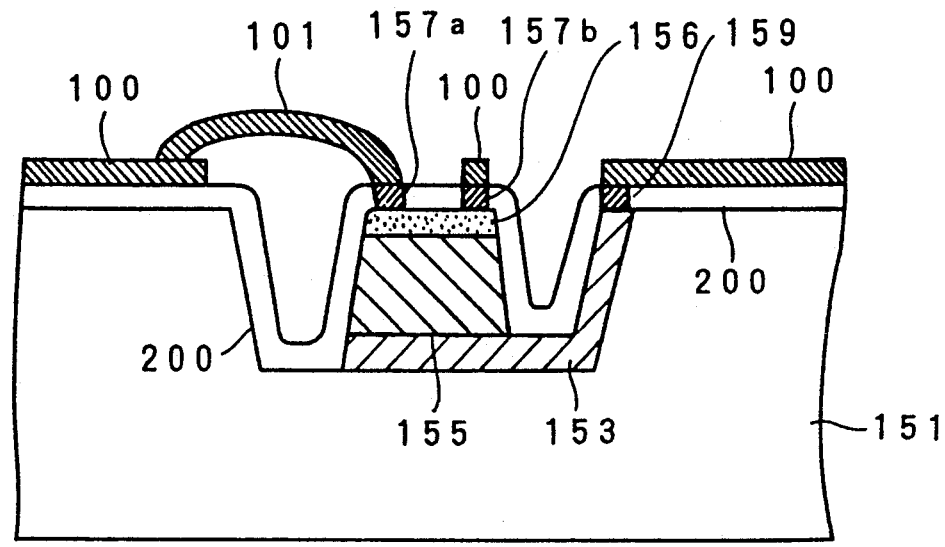
FIGS. 5A and 5B show sectional views and a plan view of a first embodiment of the lateral photo-sensing device of the present invention.
Figure 5B:
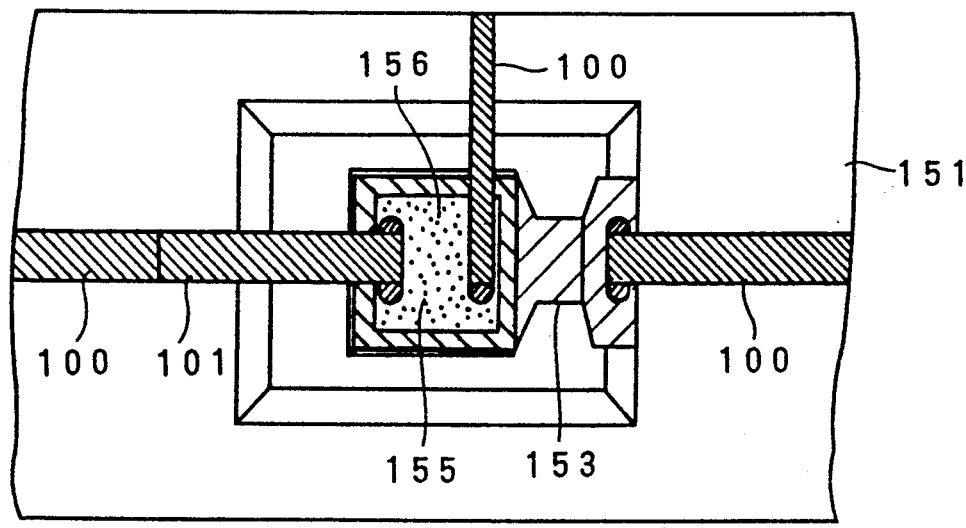

FIG. 5A shows a first embodiment of the lateral photo-sensing device and shows a sectional view of a selectively buried device. The fabrication thereof is briefly explained. A mark having an opening of a $SiN_x$ film or a $SiO_2$ film is formed on an InP semi-insulative substrate 151 and a recess is formed in the opening by anistropy etching. A mark is formed on the recess except a predetermined area, and a p-type layer 153 such as P+-Inp, a photo-sensing layer 155 such as n⁻-InGaAs and a buffer layer 156 such as AlInAs are sequentially eptiaxally grown in the opening by lattice alignment. Then, Schottky electrodes 157a and 157b such as Ti are vapor-deposited at desired positions on the buffer layer 156, and a p-type ohmic electrode 159 such as AuZn is also formed. Thereafter, an insulation film 200 is deposited and appropriate wiring 100 are formed. An air bridge is formed over the Schottky electrode 157a to the left wiring 100. In this manner, a perfectly planar device is formed. FIG. 5B shows a plan view of the lateral photo-sensing device.

Figure 6A:
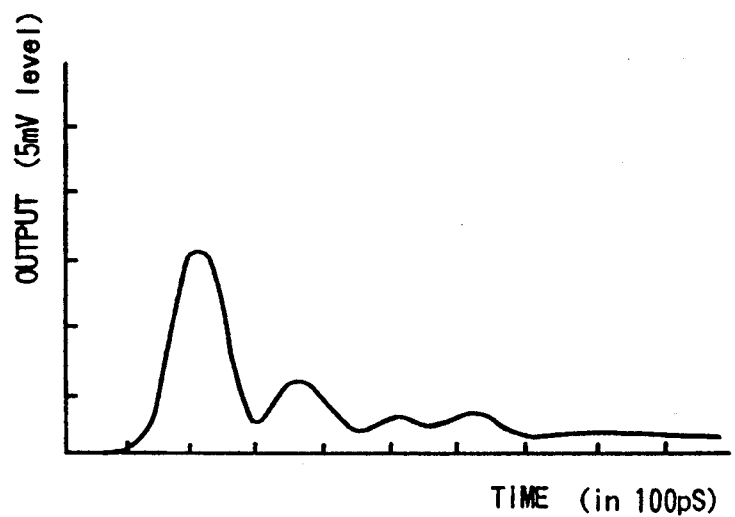
FIGS. 6A and 6B illustrate an operation of the lateral photo-sensing device of the present invention.
Figure 6B:
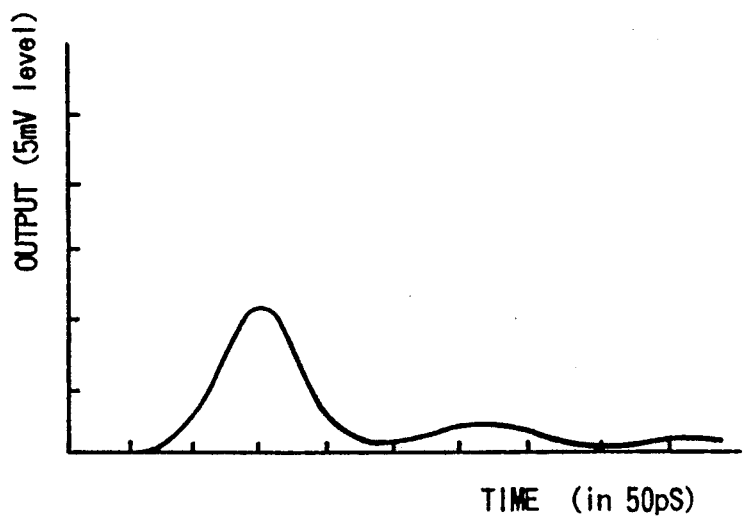

FIGS. 6A and 6B briefly illustrate the operation of the lateral photo-sensing device of FIGS. 5A and 5B. FIG. 6A shows a light pulse response characteristic of the device when the bias voltage is not applied to the p-type ohmic electrode 159. A device output may be taken out by the carriers of both types which are photo-generated in the photo-sensing layer 155 by the incident light pulse, but it is accompanied with a tail. As a result, the response speed is lowered by the tail although the responsivity is relatively high. In the present embodiment, the fall time $t_f$ was 240 ps and the responsivity was 4 A/W. FIG. 6B shows a light pulse response characteristic of the device when a negative bias voltage is applied to the p-type ohmic electrode 159. The device output may be taken out primarily by electrons of the photo-generated carriers. As a result, the operation speed of the device is improved but the responsivity is relatively low. In the present example, the fall time $t_f$ was 50 ps and the responsivity was 0.7 A/W. In this manner, the response speed or the responsivity is variable in the lateral photo-sensing device of FIGS. 5A and 5B.

Figure 7A:
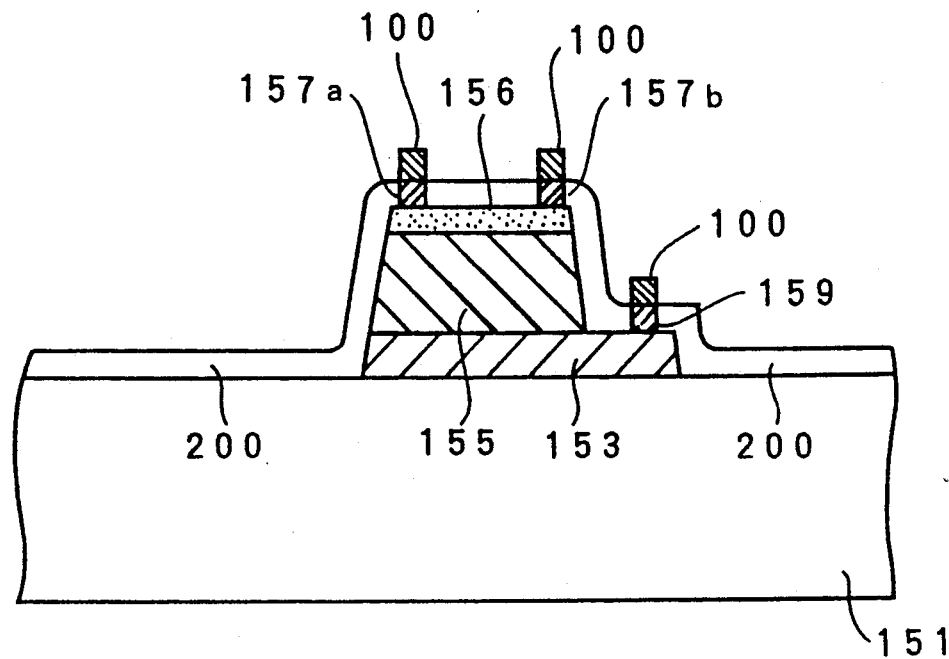
FIGS. 7A and 7B respectively show a sectional view and a plan view of a second embodiment of the lateral photo-sensing device of the present invention.
Figure 7B:
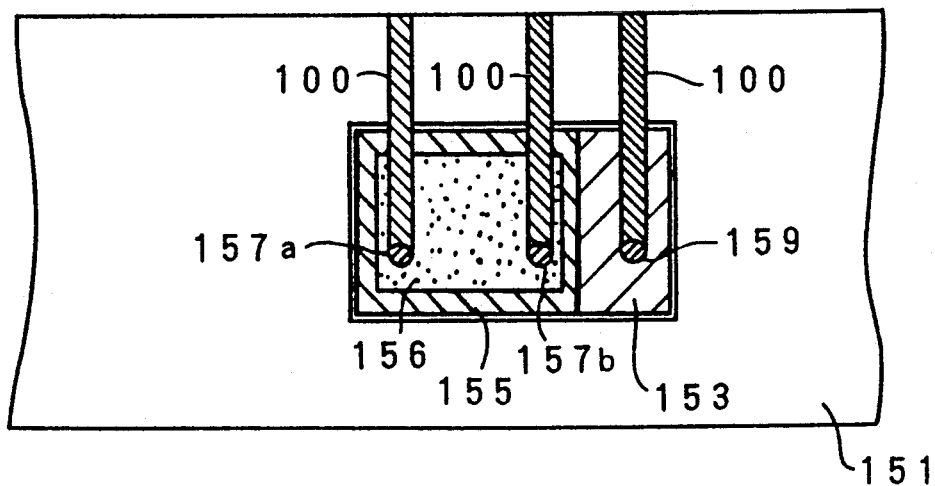

FIG. 7A shows a second embodiment of the lateral photo-sensing device and shows a sectional view of a mesa type device. The fabrication thereof is briefly explained. A p-type layer such as p+-InP, a photo-sensing layer such as n⁻-InGaAs and a buffer layer such as AlInAs are sequentially epitaxially grown on a semi-insulative substrate 151 such as InP. Those layers are etched in two steps while leaving an area in which the device is to be formed. As a result, mesa-shaped p-type layer 153, photo-sensing layer 155 and buffer layer 156 are left. Then, Schottky electrodes 157a and 157b such as Ti are formed at desired positions on the buffer layer 156 by vapor-deposition and a p-type ohmic electrode 159 such as AuZn is also formed. Thereafter, an insulation film 200 is deposited and appropriate wiring 100 are formed. Thus, a mesa type device is formed. FIG. 7B shows a plan view of such a lateral photo-sensing device.

Figure 8:
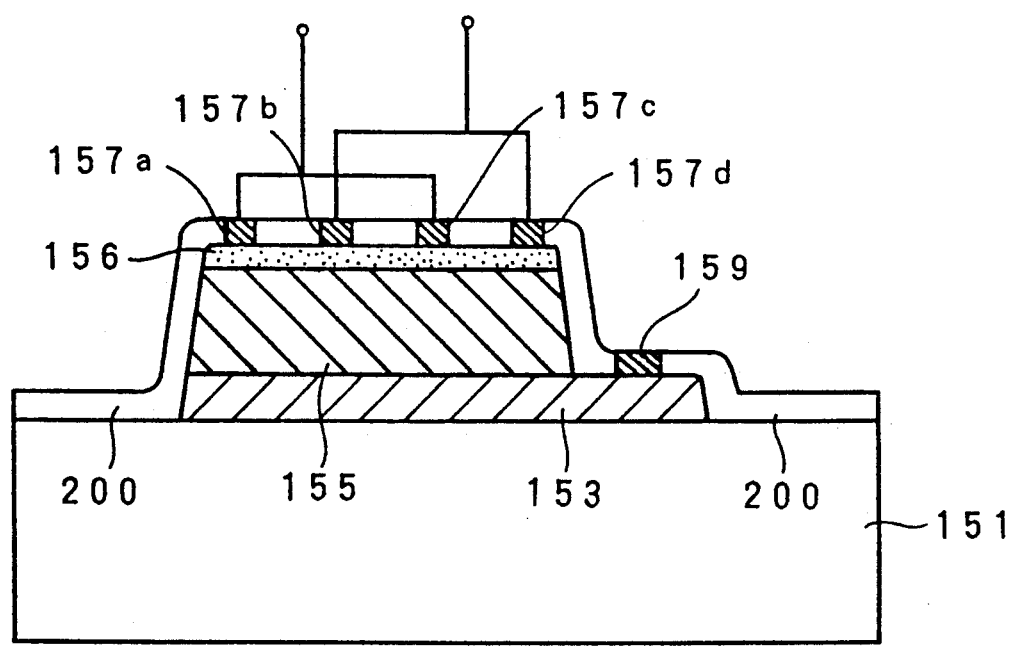
FIG. 8 shows a sectional view of a third embodiment of the lateral photo-sensing device of the present invention.

FIG. 8 shows a third embodiment of the lateral photo-sensing device and shows a sectional view of an inter-digital integrated mesa type device. The fabrication thereof is essentially the same as that of the second embodiment, except that four Schottky electrode 157a, 157b, 157c and 157d are vapor-deposited on the buffer layer 156 with an appropriate line-and-space pattern. The four Schottky electrodes 157a to 157d are interdigitally connected by appropriate wiring after the deposition of an insulation film 200. The lateral photo-sensing device of the present embodiment can shorten the moving distance of the carriers so that the operation speed of the device is improved. An operation with a reverse bias is also permitted. Further, a detection responsivity is further enhanced by detecting a signal light directed to a rear surface of the lateral photo-sensing device.

The present invention is not limited to the above embodiments. For example, the semi-insulative substrate 151 may be made of GaAs or other materials, the p-type layer 153 may be made of InGaAs or other materials, and the photo-sensing layer 155 and the buffer layer 156 may be made of AlGaAs or other materials. The Schottky electrodes may be made of Al or other materials. A semiconductor layer such as n+-InP may be used instead of the p-type layer 153, and the photo-sensing layer 155 may be p−-InGaAs.

In accordance with the lateral photo-sensing device of the present invention, the pair of Schottky type electrodes are formed as the device electrodes. Accordingly, the re-injunction of the carriers is suppressed and the operation speed is improved. Further, the response speed or the responsivity of the device is variable by controlling the voltage applied to the biasing electrode formed on the first semiconductor layer.

An embodiment of the OEIC is now explained with reference to the drawings.

Figure 9:
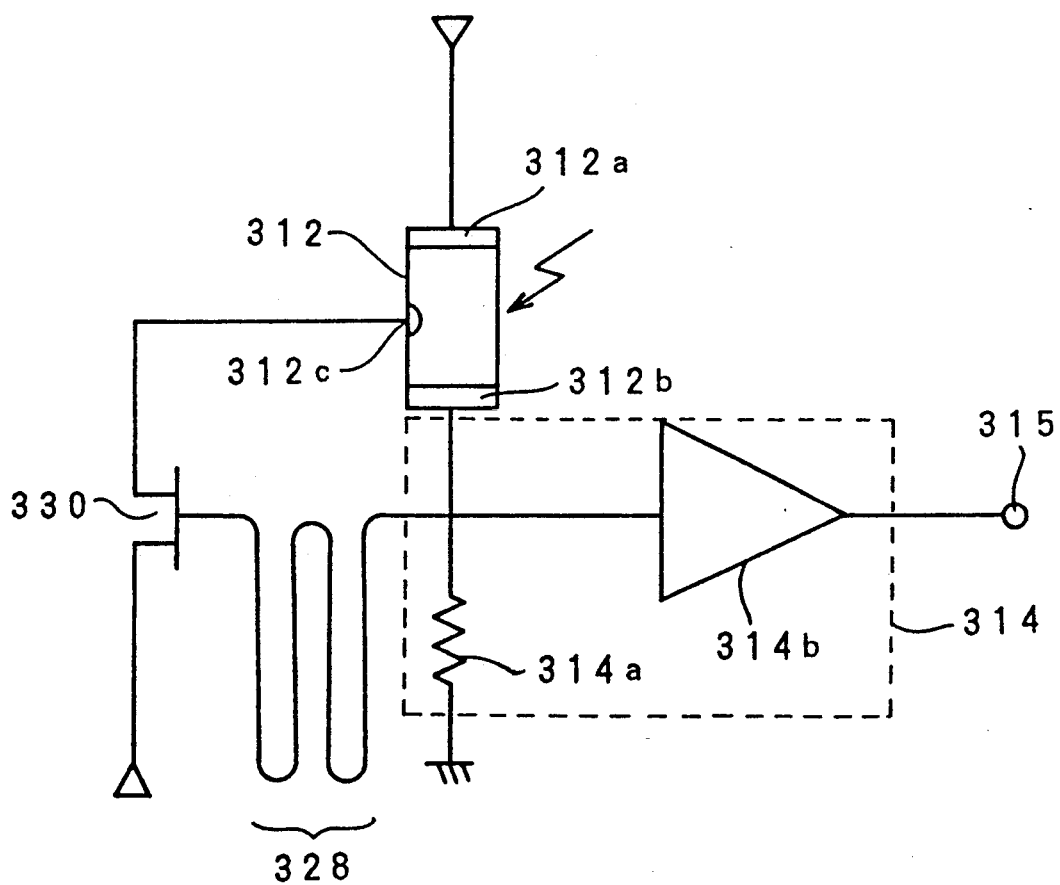
FIG. 9 shows a configuration of an embodiment of the opt-electronic integrated circuit of the present invention.

FIG. 9 shows a circuit configuration of one embodiment of the OEIC. A lateral photo-sensing device 312 has an input terminal 312a and an output terminal 312b. A voltage for driving the lateral photo-sensing device 312 is applied to the input terminal 312a, and a resistor 314a is connected to the output terminal 312b. A control electrode 312c is connected to a source or drain of a high speed switching device 330 such as an FET. The other terminal of the high speed switching device 330 is connected to an appropriate power supply. A current taken out of the output terminal 312b of the lateral photo-sensing device 312 is converted to a voltage detection signal by the resistor 314a, and it is amplified by an amplifier 314b and taken out of a terminal 315. On the other hand, the detection signal converted to the voltage by the resistor 314a is converted to a delay signal by a delay circuit 328 and it is applied to a gate of the high speed switching device 330, which responds to the delay signal to switch the signal to control the operation condition of the lateral photo-sensing device 312. The long tail of the detection signal taken out of the resistor 14a is thus eliminated as will be explained in detail hereinafter.

Figure 10:
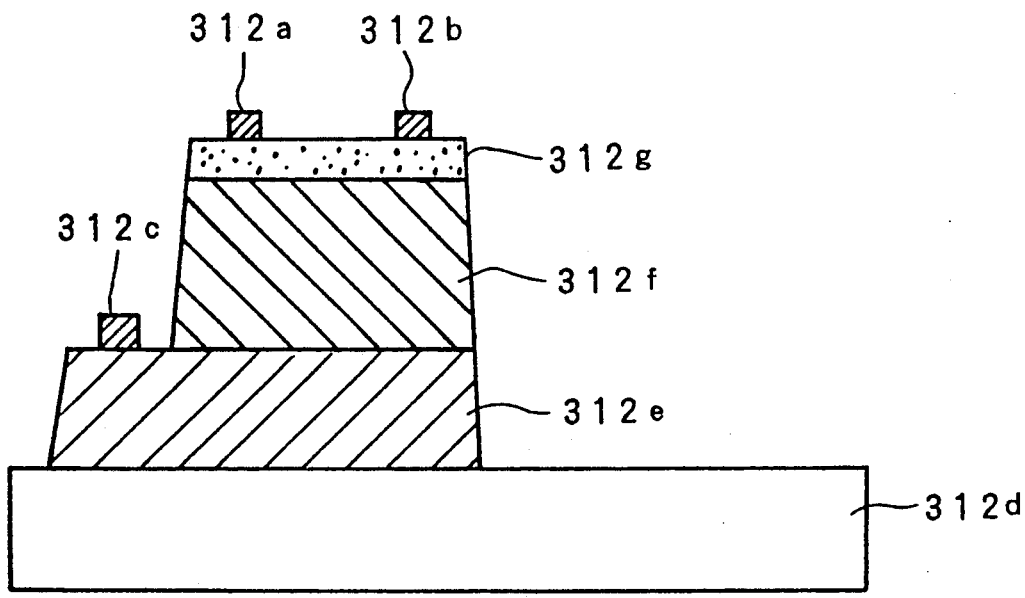
FIG. 10 shows a configuration of a lateral photo-sensing device of the opt-electronic integrated circuit of FIG. 9.

FIG. 10 shows a configuration of the lateral photo-sensing device 312 of FIG. 9. As shown, a p-type InP layer 312e is crystal-grown on a semi-insulative InP substrate 312d, and a photo-sensing layer 312f made of an n-type In Ga As and a buffer layer 312g made of Al In As are crystal-grown thereon by lattice alignment. Thereafter, Schottky electrodes made of Ti/Pt/Au which serve as the input terminal 312a and the output terminal 312b are formed on the buffer layer 312g. A p-type ohmic electrode which serves as the control electrode 312c is formed on layer 312e.

Figure 11A:
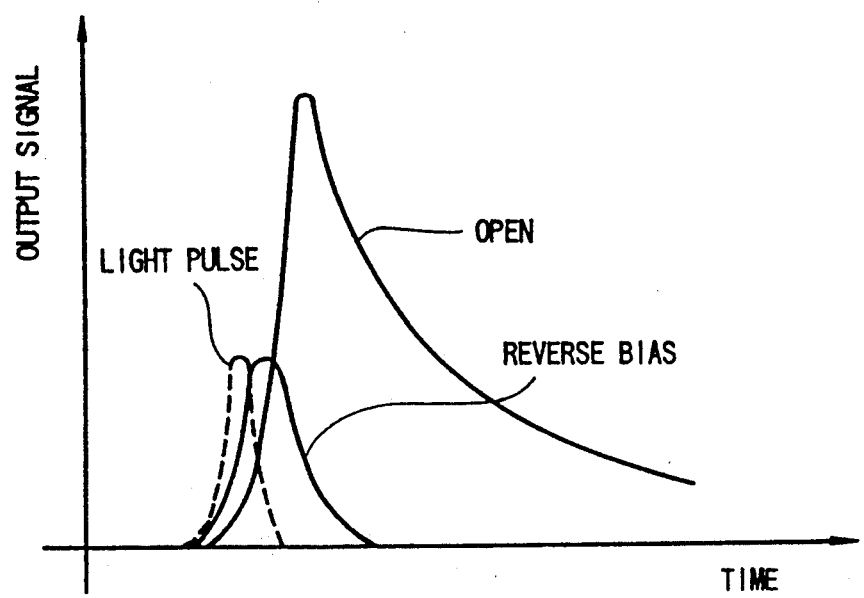
FIGS. 11A and 11B explain an operation of the opt-electronic integrated circuit of FIG. 9.
Figure 11B:
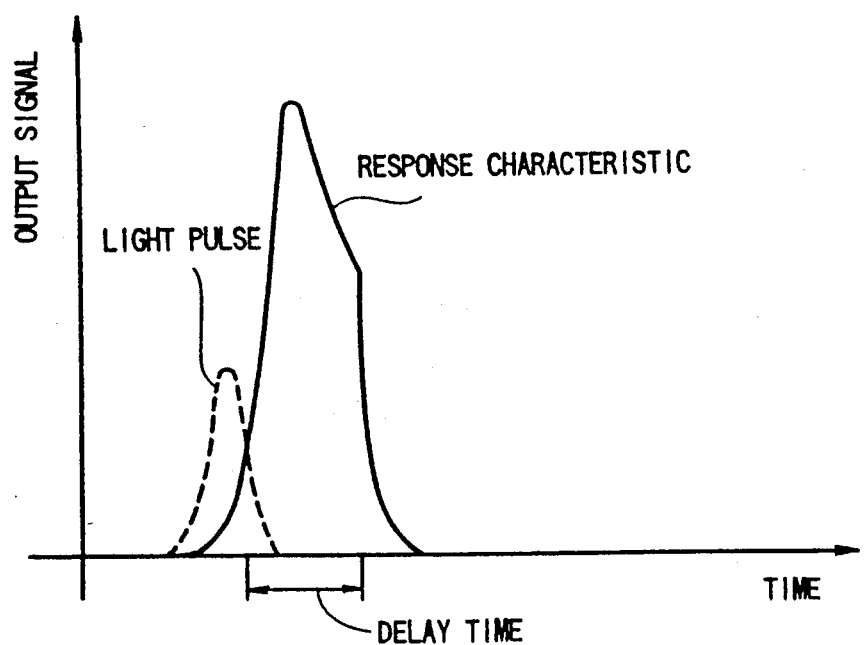

FIGS. 11A and 11B briefly explain an operation of the OEIC of FIG. 9. FIG. 11A shows an operation when the delay circuit 328 and the high speed switching device 330 are not provided. In this case, since no voltage is applied to the control electrode 312c (open), a resistance between the terminals 312a and 312b is reduced by the carriers which are photo-generated in the photo-sensing layer 312f by the light pulse (broken line in FIG. 11A) so that a current corresponding to the drive voltage applied across the terminals 312a and 312b can be taken out, and an amplified signal thereof is produced at the terminal 315 (solid line in FIG. 11A). The output at the terminal 315 has a fast rise time and a higher peak than that of the pin-PD but a long tail appears in the light pulse response due to the presence of a number of holes. On the other hand, when a negative voltage is applied to the control electrode 312c (reverse bias), holes of the carriers which are photo-generated in the photo-sensing layer 312f by the light pulse are absorbed by the InP layer 312e and collected to the control electrode 312c. As a result, the responsivity of the lateral photo-sensing device is reduced but the long tail does not appear in the light pulse response (solid line in FIG. 11A).

FIG. 11B shows an actual operation when the delay circuit 328 and the high speed switching device 330 are provided. The voltage at the source or drain of the high speed switching device 330 is preset not to apply a voltage to the control electrode 312c, and a light pulse (broken line in FIG. 11B) is applied to the lateral photo-sensing device 312. The detection signal corresponding to the reduction of the resistance between the terminals 312a and 312b by the carriers which are photo-generated in the photo-sensing layer 312f by the light pulse is taken out of the resistor 314a and it is supplied to the amplifier 314b and the delay circuit 328. The detection signal after the amplification by the amplifier 14b is substantially equal to the output in the open state shown by the solid line in FIG. 11A. However, since the delay signal is applied to the gate of the high speed switching device 330 after the time period corresponding to the time constant of the delay circuit 328, the signal produced by the amplifier 314b is different from that in the open state shown by the solid line in FIG. 11A. Namely, since the high speed switching device 330 switches to apply the negative bias to the control electrode 312c, the photo-generated holes are taken out of the control electrode 312c. As a result the detection output of the device is lowered and the long tail in the light pulse response is prevented. Thus, the OEIC of FIG. 9 has a high peak responsivity and produces a high response output without a long tail (solid line in FIG. 11A).

Figure 12A:
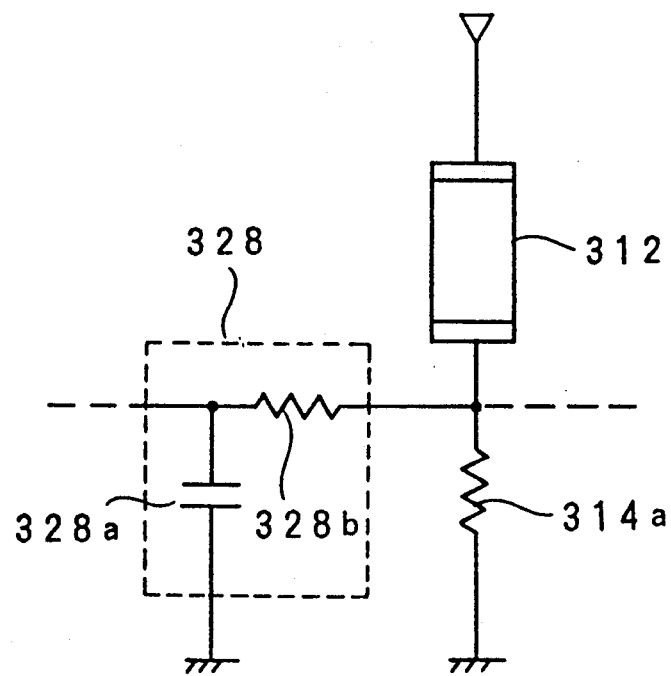
FIGS. 12A and 12B show delay circuits of the opt-electronic integrated circuit of FIG. 9.
Figure 12B:
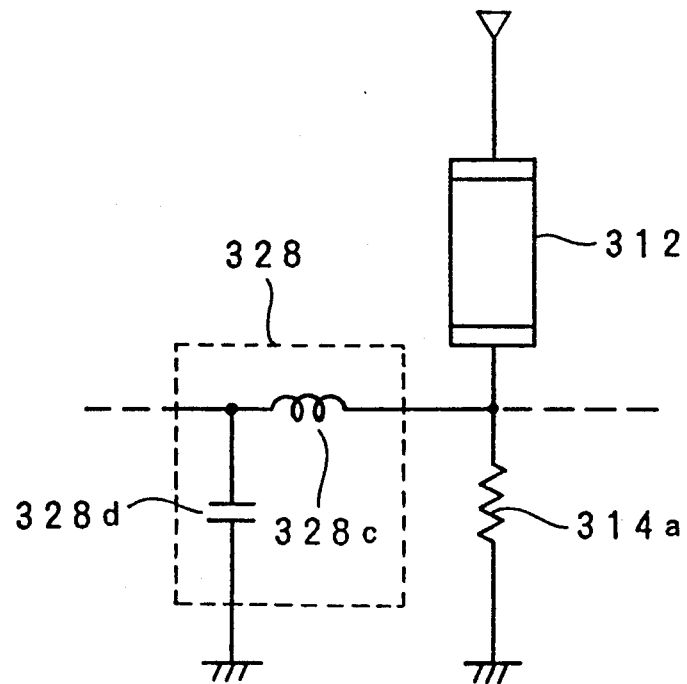

FIGS. 12A and 12B show specific configurations of the delay circuit 328. A delay circuit shown in FIG. 12A comprises a capacitor 328a and a resistor 328b. By properly selecting the capacitor 328a and the resistor 328b, the delay time of the delay signal produced by the delay circuit 328 can be controlled. A delay circuit shown in FIG. 12B comprises an inductor 328c and a capacitor 328d.

Figure 13A:
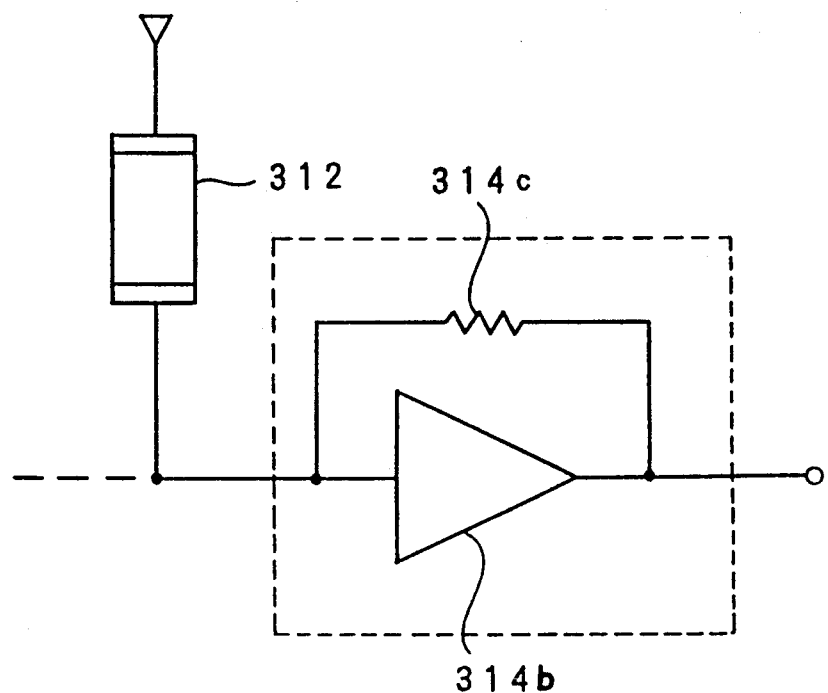
FIGS. 13A and 13B show amplifier circuits of the opt-electronic integrated circuit of FIG. 9.
Figure 13B:
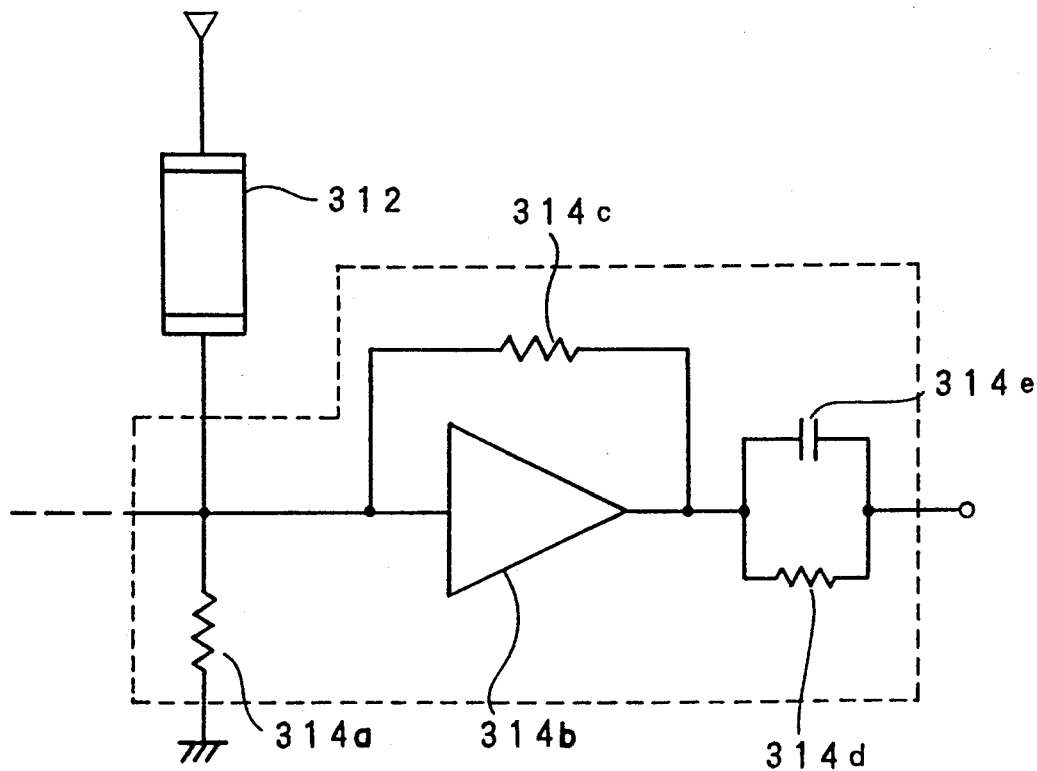

FIGS. 13A and 13B show specific configurations of the amplifier circuit 314 which comprises the resistor 314c and the amplifier 314b. FIG. 13A shows a trans-impedance type amplifier circuit which comprises the amplifier 314b and a resistor 314c, FIG. 13B shows a high impedance type amplifier circuit which comprises an input stage resistor 314a, the amplifier 314b, resistors 314c and 314d and a capacitor 314e.

The delay circuit 328 and the amplifier circuit 314 shown in FIGS. 12A, 12B, 13A and 13B may be combined in any manner. The lateral photo-sensing device 312, the delay circuit 328 and the amplifier circuit 314 may be integrally formed on one semiconductor substrate to form one OEIC. A plurality of lateral photo-sensing devices may be integrally formed on one semiconductor substrate to form an OEIC having a plurality of lateral photo-sensing devices 312. The high speed switching device 330 may be MESFET, MISFET, HEMT or HBT.

In accordance with the opt-electronic integrated circuit of the present invention, the pair of Schottky type electrodes are formed as the device electrodes so that the reinfection of the carriers is suppressed and the high speed operation is attained. Further, since the control circuit eliminates the long tail inherent to the detection signal of the lateral photo-sensing device, the high speed operation, the high responsivity operation and the operation at a low bias voltage are attained.

Next an embodiment of an OEIC capable of realizing the above third object of the present invention, that is an photo-receiving OEIC which has a low heat generation and low noise will be explained.

Before the explanation of embodiment of the OEIC, an example of a lateral photo-sensing device used in the OEIC is briefly explained.

Figure 14:
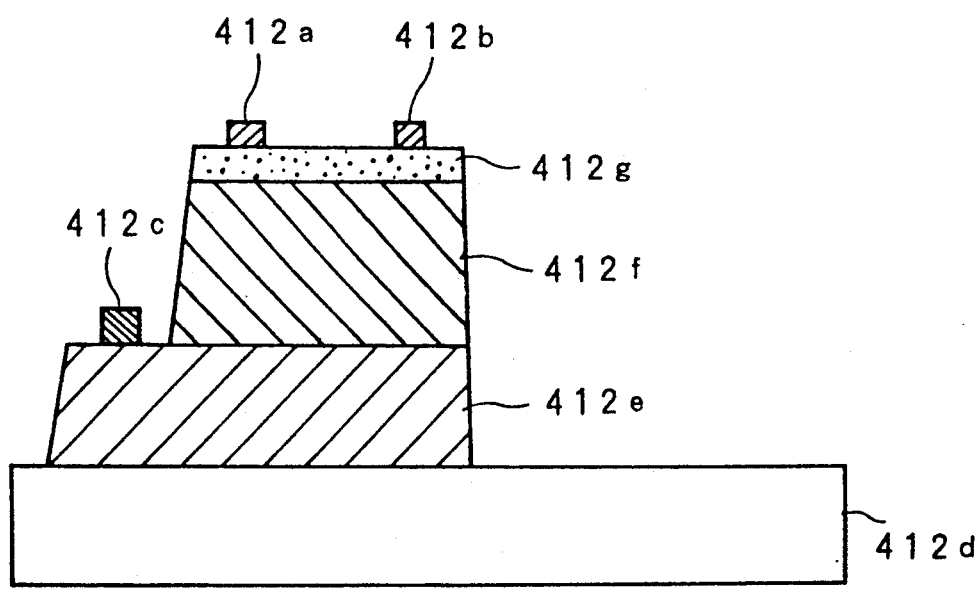
FIG. 14 shows a structure of a lateral photo-sensing device of an opt-electronic integrated circuit of the present invention.

FIG. 14 shows a structure of the lateral photo-sensing device. As shown, a first layer 412e made of GaAs is crystal-grown on a substrate 412d made of semi-insulative GaAs, and a second layer 412f made of n-type GaAs and a buffer layer 412g made of AlGaAs are crystal-grown thereon by lattice alignment. Thereafter, Schottky electrodes made of Ti/Pt/An which serve as an input electrode 412a and an output electrode 412b are formed on the buffer layer 412g. A p-type ohmic electrode which serves as a biasing electrode 412c is formed at an end of the first layer 412e.

Figure 15A:
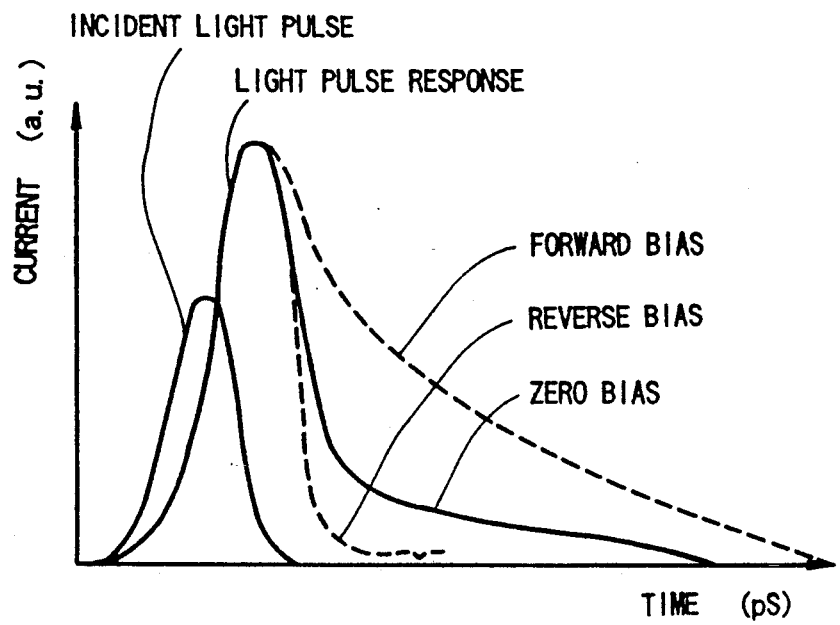
FIGS. 15A and 15B explain an operation of the lateral photo-sensing device of FIG. 14.
Figure 15B:
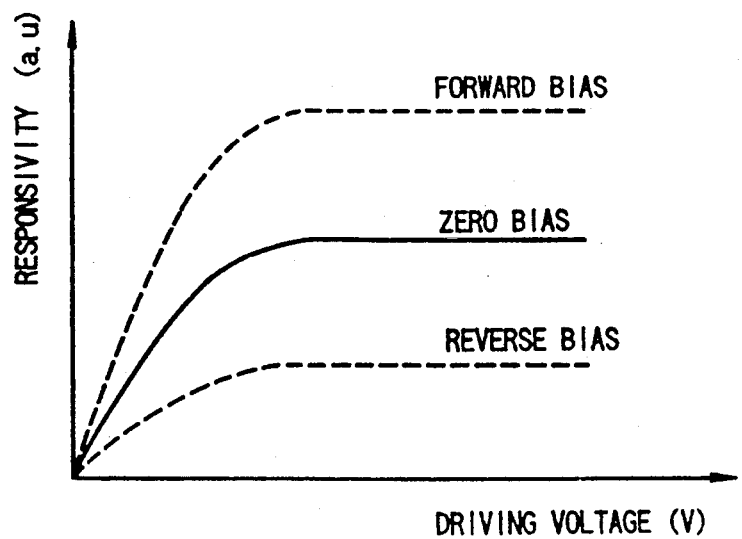

FIGS. 15A and 15B explain an operation of the lateral photo-sensing device of FIG. 14. When no voltage is applied to biasing electrode 412c (zero bias), a resistance between the electrodes 412a and 412b is reduced by the carriers which are photo-generated in the second layer 412f by a light pulse (solid line in FIG. 15A) so that a pulse response corresponding to a drive voltage applied across the electrodes 412a and 412b is produced (solid line in FIG. 15A). When a positive voltage is applied to the biasing electrode 412c (forward bias), a long tail appears in the light pulse response (broken line in FIG. 15A). On the other hand, when a negative voltage is applied to the biasing electrode 412c (reverse bias), the holes of the carriers which are photo-generated in the photo-sensing layer 412f by the light pulse are absorbed by the GaAs layer 412e and collected to the biasing electrode 412c. And a result, no long tail appears in the light pulse response and the high speed operation of the device is attained (broken line in FIG. 15A), but the responsivity of the lateral photo-sensing device is lowered (broken line in FIG. 15B).

An embodiment of the OEIC is now explained with reference to the drawings.

Figure 16:
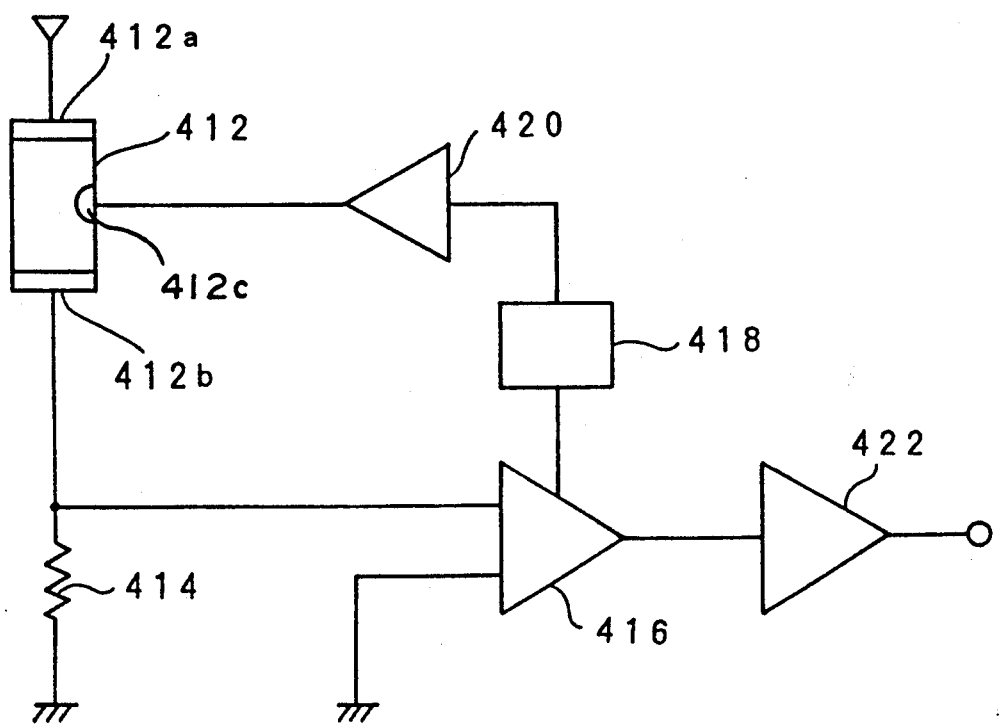
FIG. 16 shows a configuration of one embodiment of the opt-electronic integrated circuit of the present invention.

FIG. 16 shows a circuit configuration of the embodiment of the OEIC. A voltage to drive a lateral photo-sensing device 412 is applied to an input electrode 412a of the lateral photo-sensing device 412, and a load resistor 414 is connected to an output electrode 412b. A current taken out of the output electrode 412b of the lateral photo-sensing device 412 is converted to a voltage detection signal by the load resistor 414, and it is amplified by a pre-amplifier 416 and supplied to a post amplifier 422. The amplified detection signal is take out of the OEIC. The output of the pre-amplifier 416 is also supplied to a signal level detector 418 having a low-pass filter and a reference voltage generator to produce an average level voltage signal, which is inverted and amplified by a biasing amplifier 420 having a certain current drive ability, and it is applied to the biasing electrode 412c of the lateral photo-sensing device 412 as the bias voltage. In this manner, the automatic gain control of the detection signal taken out of the load resistor 414 is attained by feeding the detection signal converted to the average level voltage signal back to the biasing electrode 412c, as will be explained in detail hereinafter.

An operation of the OEIC of FIG. 16 is now explained.

When a light pulse is applied to the OEIC of FIG. 16, the resistance between the electrode 412a and 412b is reduced by the carriers which are photo-generated in the second layer 412f, and a current corresponding to the drive voltage applied between the electrodes 412a and 412b is taken out. The current is converted to the voltage detection signal by the load resistor 414, and it is amplified by the pre-amplifier 416 and the post amplifier 422. The output of the pre-amplifier 416 is also applied to the signal level detector 418. A high frequency component of the detection signal from the output electrode 412b is eliminated by the signal level detector 418 so that the signal is flattened. As a result, the average level voltage signal is produced. The voltage signal is inverted and amplified by the biasing amplifier 420 and the output thereof is applied to the biasing electrode 412c as the bias voltage. For example, when the intensities of the light pulses applied to the lateral photo-sensing device 412 increase on average and the average level of the detection signal arise accordingly, the bias voltage applied to the biasing electrode 412c decreases. As a result, the responsivity is reduced by the operational characteristic of the lateral photo-sensing device. On the other hand, when the intensities of the light pulses applied to the lateral photo-sensing device 412 decrease on average and the average level of the detection signal falls and accordingly, the bias voltage applied to the biasing electrode 412c rises. As a result, the responsivity is increased by the operational characteristic of the lateral photo-sensing device. Namely, the gain control (AGC) is attained in accordance with the intensities of the light pulses applied to the lateral photo-sensing device 412.

In the OEIC of the present embodiment, the gain is controlled by the variable responsivity lateral photo-sensing device. Since the gain in controlled in a preceding stage to the pre-amplifier, there is no need to control the gain of the pre-amplifier and the high speed, low noise and high efficiency OEIC is provided. Further, the overall circuit of the OEIC is simplified.

In the present embodiment, the pre-amplifier 416 is of high impedance type although it may be of trans-impedance type. The post amplifier 422 may be omitted.

Figure 17:
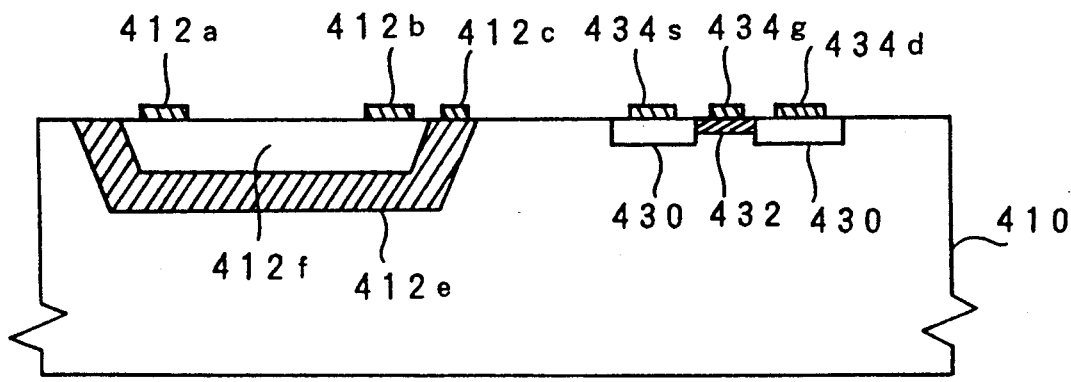
FIG. 17 shows an example of the opt-electronic integrated circuit of FIG. 16.

FIGS. 17 to 22 show specific fabricated examples of the OEIC. As shown in FIG. 17, in an area of a semi-insulative GaAs substrate 410 in which the photo-sensing device is to be formed (left side in the drawing), a p-type GaAs layer 412e to which a bias voltage is to be applied and an n-type GaAs layer 412f which serves as a light absorbing layer are crystal-grown in a groove formed by etching. A pair of Ti/Pt/Au electrodes 412a and 412b for taking out signals are formed on the p-type GaAs layer 412f. An ohmic electrode 412c which serves as the biasing electrode is formed on an exposed area of the p-type GaAs layer 412e. On the other hand, a contact area 430 and an activation layer 432 are formed by ion implantation in an area of the GaAs substrate 410 in which a signal processing circuit is to be formed (right side in the drawing), and electrodes 434s, 434g and 434d are formed thereon. The electrode 434s, 434g and 434d function as source, gate and drain electrodes, respectively to form an FET of a signal processing circuit component. In addition to the FET, a resistor and a capacitor are formed in the signal processing formation area to form the pre-amplifier, the signal level detector and the biasing amplifier 415.

In the example shown in FIG. 17, the p-type GaAs layer 412e and the n-type GaAs layer 412f are buried and grown and the circuit components of the signal processing circuit are formed on the surface of the GaAs substrate 410 by ion implantation. Therefore, the flatness of surface is good and the device can be manufactured by a series of steps.

The device of the present invention is not limited to the above structure but it may be one of those shown in FIGS. 18 to 22.

Figure 18:
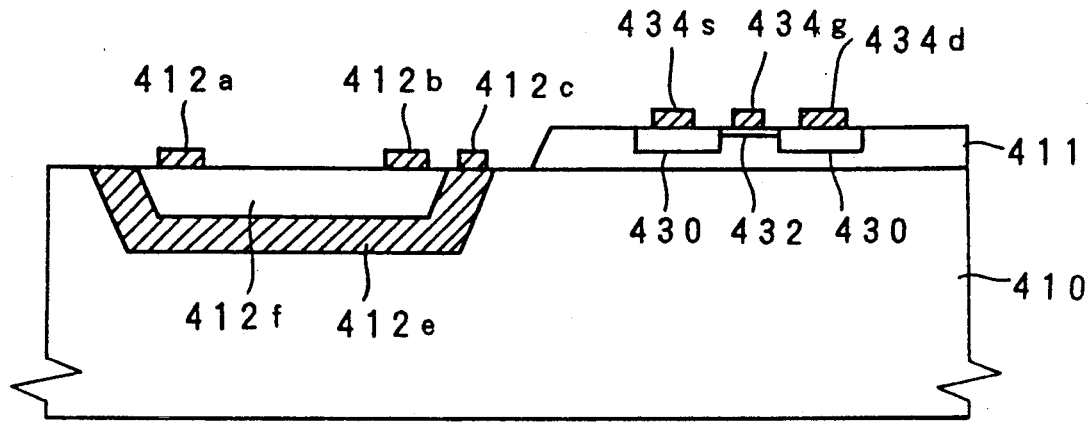
FIG. 18 shows another example of the opt-electronic integrated circuit of FIG. 16.
Figure 19:
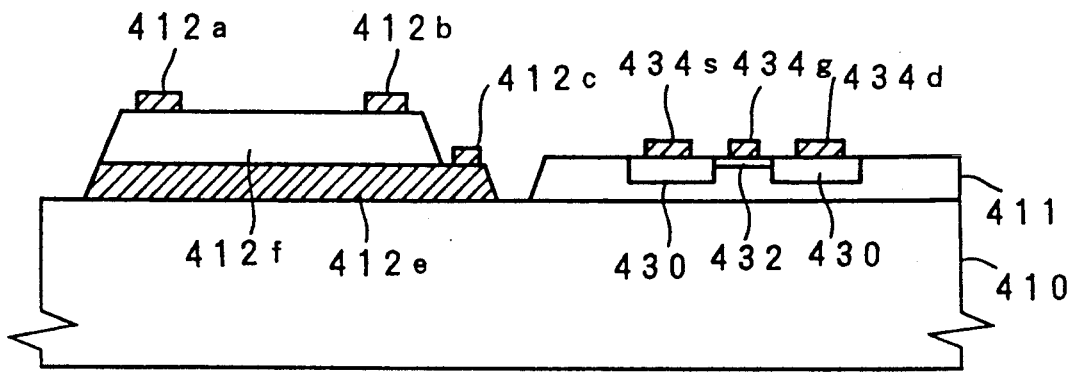
FIG. 19 shows other example of the opt-electronic integrated circuit of FIG. 16.
Figure 20:
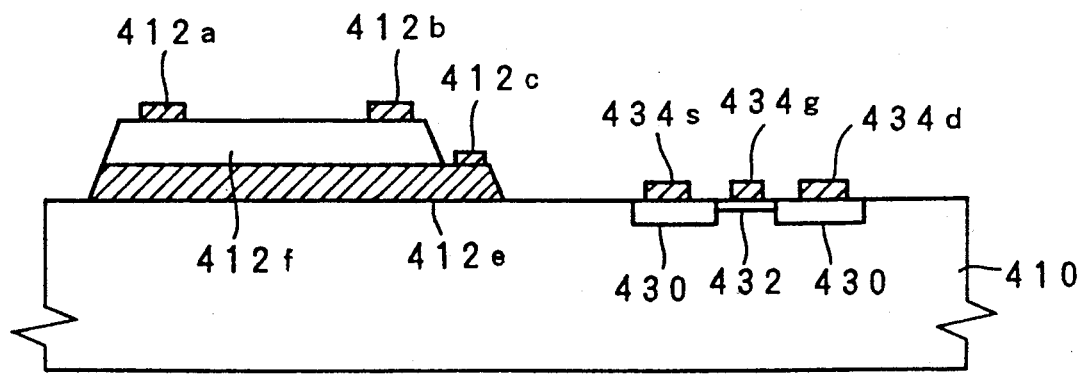
FIG. 20 shows a further example of the opt-electronic integrated circuit of FIG. 16.
Figure 21:
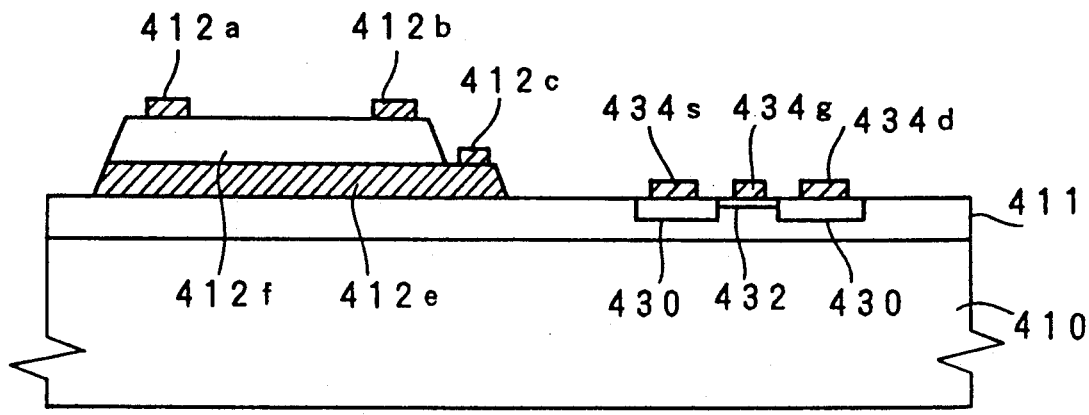
FIG. 21 shows a further example of the opt-electronic integrated circuit of FIG. 16.
Figure 22:
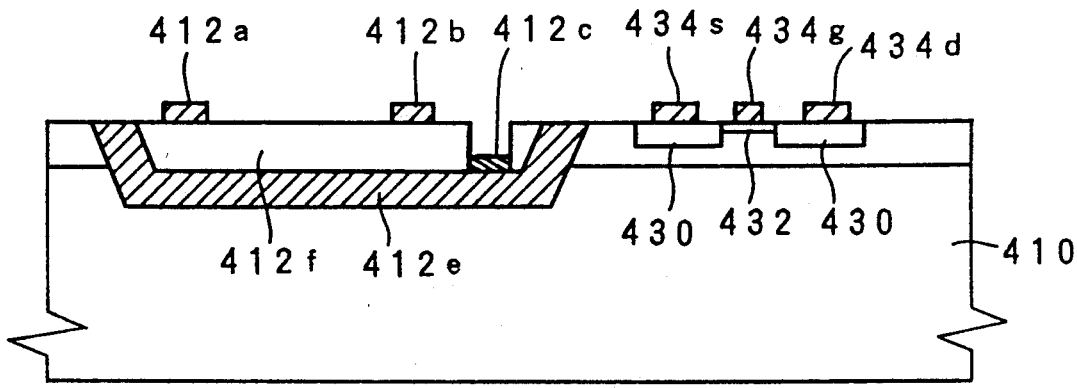
FIG. 22 shows a further example of the opt-electronic integrated circuit of FIG. 16.

An embodiment shown in FIG. 18 is different from that of FIG. 17 in that the FET is not directly formed on the GaAs substrate 410 but a mesa-shaped GaAs epitaxial layer 411 is formed on the GaAs substrate 410 and the FET is formed therein. An example of FIG. 19 is different from that of FIG. 18 in that the GaAs layers 412e and 412f which serve as the light absorbing layers are of mesa structure. In those examples, the characteristic of the FET can be improved but the flatness is worse than that of FIG. 17. In examples shown in FIGS. 20 and 21, the GaAs layers 412e and 412f which serve as the light absorbing layers are of mesa structure, and they differ from each other in that the GaAs epitaxial layer 411 is formed on the entire surface of the GaAs substrate 410 or not on the entire surface. In an example shown in FIG. 22, the GaAs epitaxial layer 411 is grown on the entire surface of the GaAs substrate 410 and the GaAs layers 412e and 412f which serve as the light absorbing layers are buried therein. Thereafter, a portion of the GaAs layer 412f is removed and the ohmic electrode 412c is formed in the area to which the GaAs layer 412e is exposed. As a result, the flatness is good and the characteristic of the FET is good.

In accordance with the opt-electric integrated circuit of the present invention, since the control circuit changes the bias voltage to be applied to the biasing electrode in accordance with the level of the detection signal from the lateral photo-sensing device, the responsivity of the lateral photo-sensing device can be directly controlled by the feedback. As a result, an opt-electronic circuit which has a low noise, a wide dynamic range and a low power consumption is provided. Further, since the integration density is low, the opt-electronic integrated circuit can be manufactured in a simple process.

Next an embodiment of a photo logic device capable of obtaining the above fourth object of the present invention will be explained.

Firstly a conceptual construction of the photo-logic device is now explained with reference to the drawings.

Figure 23:
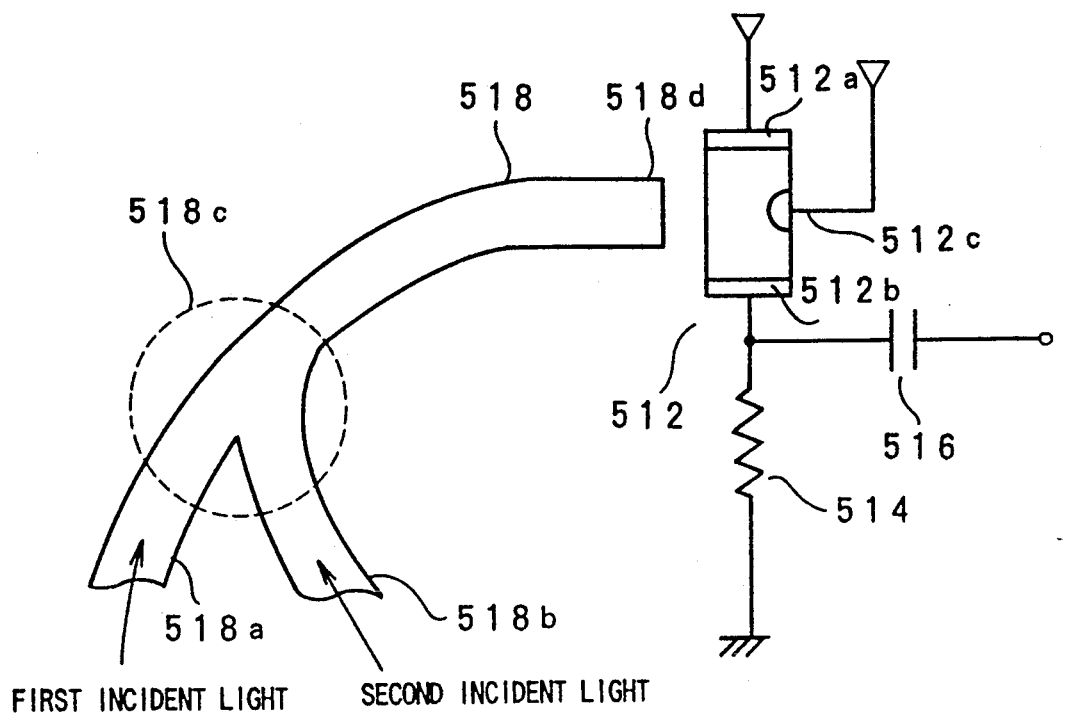
FIG. 23 shows a structure of a photo-logic device of the present invention.

FIG. 23 shows a construction of the photo-logic device according to the present embodiment. A voltage to drive a lateral photo-sensing device 512 is applied to an input electrode 512a of the lateral photo-sensing device 512, and a load resistor 514 is connected to an output electrode 512b. A current taken out of the output electrode 512b of the lateral photo-sensing device 512 is converted to a voltage detection signal by the load resistor 514 and it is also taken out of the photo-logic device through a capacitor 516. A bias voltage is supplied from an appropriate power supply to a biasing electrode 512c of the lateral photo-sensing device 512. The sensitivity of the lateral photo-sensing device 512 can be controlled by the bias voltage. First and second signal lights are applied from an optical guide 518 such as a fiber to the light absorbing layer of the lateral photo-sensing device 512. The first and second signal light are applied to first and second input ports 518a and 518b, respectively, and they are coupled by a coupler 518c and exit from an output port 518d.

Figure 24:
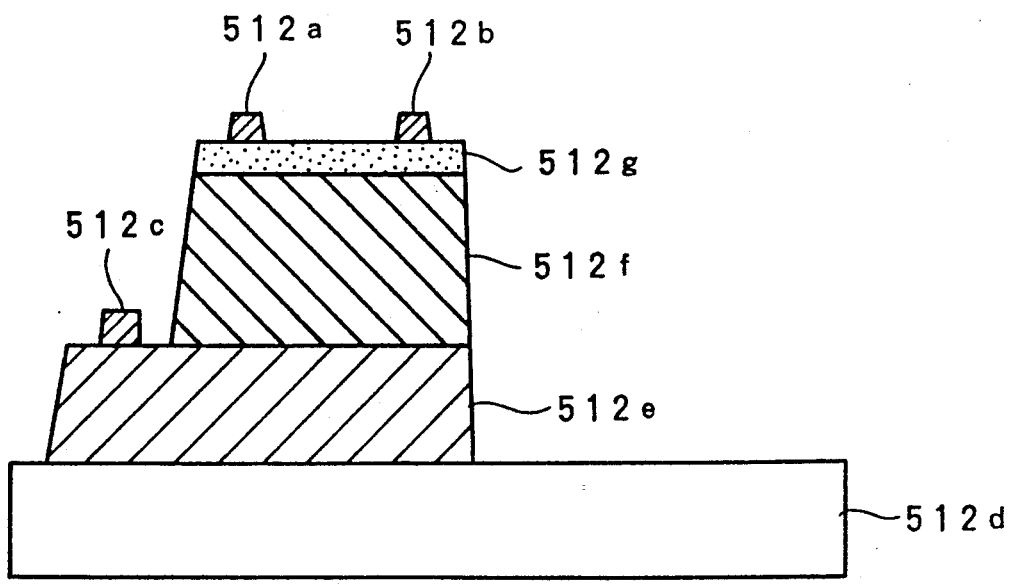
FIG. 24 shows a structure of a lateral photo-sensing device of FIG. 23.

Before the explanation of an operation of the photo-logic device used in the photo-logic device is briefly explained. FIG. 24 shows a structure of the lateral photo-sensing device. As shown, a p-type InP first layer 512e is crystal-grown on a semi-insulative InP substrate 512d, and an n-type In Ga As second layer 512f which serves as a light absorbing layer is crystal-grown thereon by lattice alignment, and an Al In As buffer layer 512g is crystal-grown by lattice alignment. Thereafter Ti/Pt/Au Schottky electrodes which function as the input electrode 512a and the output electrode 512b are formed on the buffer layer 512g. A p-type ohmic electrode which functions as the biasing electrode 512c is formed at an end of the first layer 512e.

Figure 25:
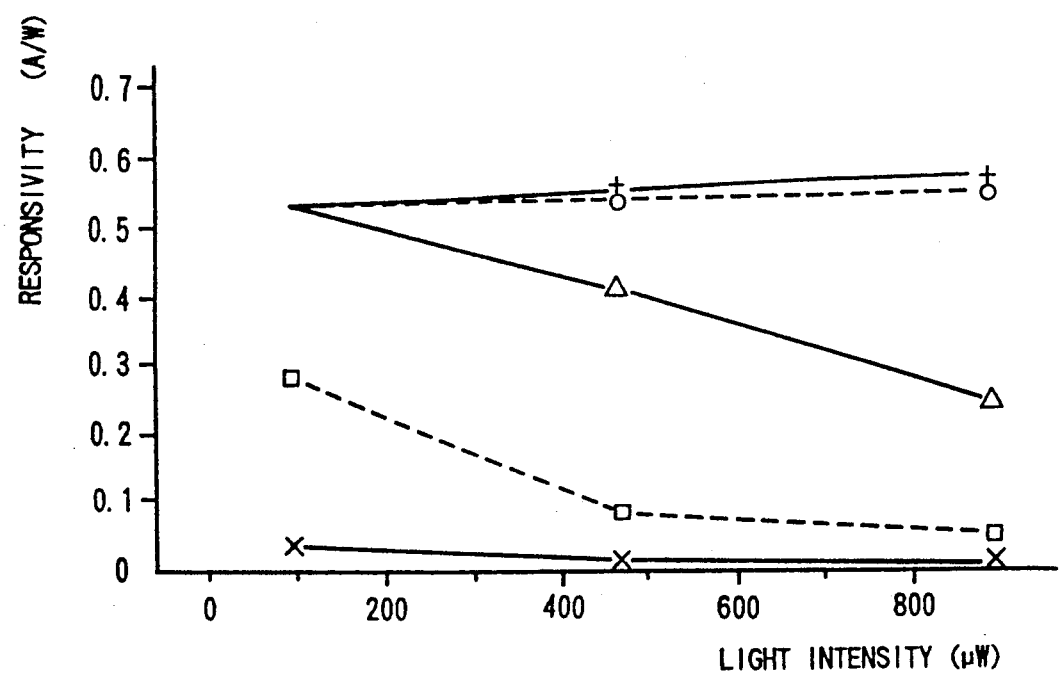
FIG. 25 shows a sensitiveness characteristic of the lateral photo-sensing device of FIG. 23.
Figure 26A:
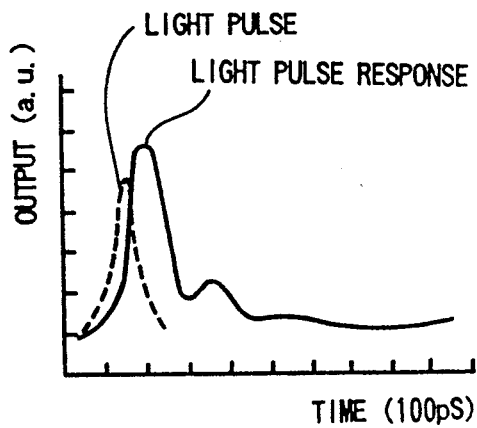
FIGS. 26A, 26B, 26C and 26D explain an operation of the photo-logic device of FIG. 23.
Figure 26B:
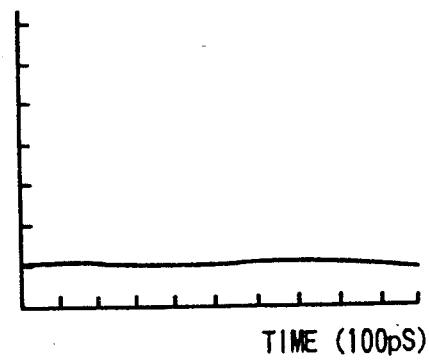
Figure 26C:
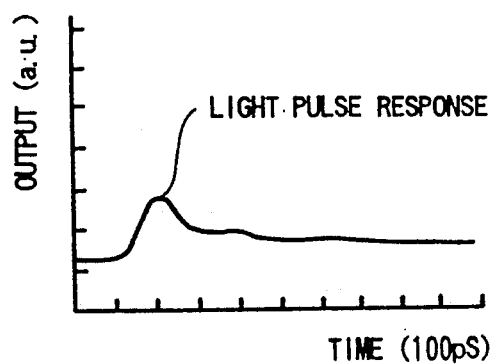
Figure 26D:
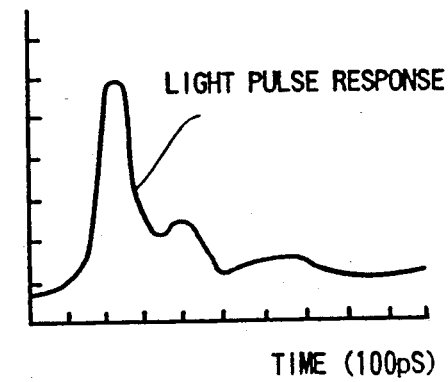

FIG. 25 shows a sensitivity characteristic of the lateral photo-sensing device of FIG. 24. An abscissa represents an intensity of light applied to the lateral photo-sensing device 512, and an ordinate represents a responsivity of the lateral photo-sensing device. Measurement points have parameters which are drive voltages applied to the electrodes 512a and 512b. The mark (+) indicates the responsivity when the drive voltage is 12 volts, the mark (○) indicates the responsivity when the drive voltage is 5 volts, the mark (Δ) indicates the responsivity when the drive voltage is 4 volts, the mark (□) indicates the responsivity when the drive voltage is 3 volts, and the mark X indicates the responsivity when the drive voltage in 1 volts. As shown, it is seen that the responsivity decreases with the intensity of the incident light when the drive voltage is smaller than 4 volts. This is called a space charge effect. Namely, when the intensity of the light applied to the photo-sensing device is high, the responsivity is low and the signal level is low. By utilizing this phenomenon the photo-logic device using the lateral photo-sensing device is provided. FIGS. 26A, 26B, 26C and 26D illustrates an operation of the photo-logic device of FIG. 23. FIG. 26A illustrates an operation of the photo-logic device when the biasing electrode 512c of the lateral photo-sensing device is open, a drive voltage which permits the generation of the space charge effect is applied, and a light pulse of an appropriate intensity (a broken line) is applied to the first input port 518a. In this case, a resistance between the electrodes 512a and 512b is reduced by the carriers which are photo-generated in the second layer of the lateral photo-sensing device by the light pulse so that a sufficiently large pulse response output (solid line) is produced. FIG. 26B shows a similar chart when the conditions of FIG. 26A are kept and a light pulse of an appropriate intensity and an DC light (reference light) are applied to the first and second input ports 518a and 518b, respectively. In this case, a sum of the intensities of the light pulse and the DC light exceeds a predetermined level and the space charge effect is created. As a result, no substantial light pulse response output is produced. FIG. 26C shows a similar chart when the conditions of FIG. 26B are kept, the biasing electrode 512c of the lateral photo-sensing device is grounded and the same light pulse and DC light of those of FIG. 26B are applied to the input ports 518a and 518b. In this case, holes of the carriers which are photo-generated in the photo-sensing layer 512f by the DC light are partially collected to the biasing electrode 512c. As a result, a slight pulse response output is produced in response to the light pulse. FIG. 26D shows a similar chart when the conditions of FIG. 26B are kept, a negative bias voltage is applied to the biasing electrode 512c of the lateral photo-sensing device, and the same light pulse and DC light as those of FIG. 26B are applied to the input ports 518a and 518b. In this case, most holes which are photo-generated in the photo-sensing layer 512f are collected to the biasing electrode 512c. As a result, a sufficiently large pulse response output is produced in response to the light pulse.

By utilizing the operation shown in FIGS. 26A–26D, it is possible to switch the signal light pulse by the DC light (reference light). When two signal lights are simultaneously applied to the input ports 518a and 518b as light pulses, no pulse response output is produced. Therefor the photo-logic device corresponding to EXOR is provided.

When the drive voltage of the lateral photo-sensing device is larger than a certain level (e.g. 4 volts), the responsivity of the lateral photo-sensing device does not change in accordance with the intensity of the incident light. Under this condition, with two light pulses are sequentially applied to the input ports 518a and 518b, the pulse response output is produced to any one of the light pulses so that a photo-logic device corresponding a logical OR is provided.

The operation condition of the photo-logic device can be changed in various manner by changing the voltage applied to the biasing electrode 512c of the lateral photo-sensing device between positive and negative. For example, the switching function of the signal light by the reference light may be released.

Figure 27:
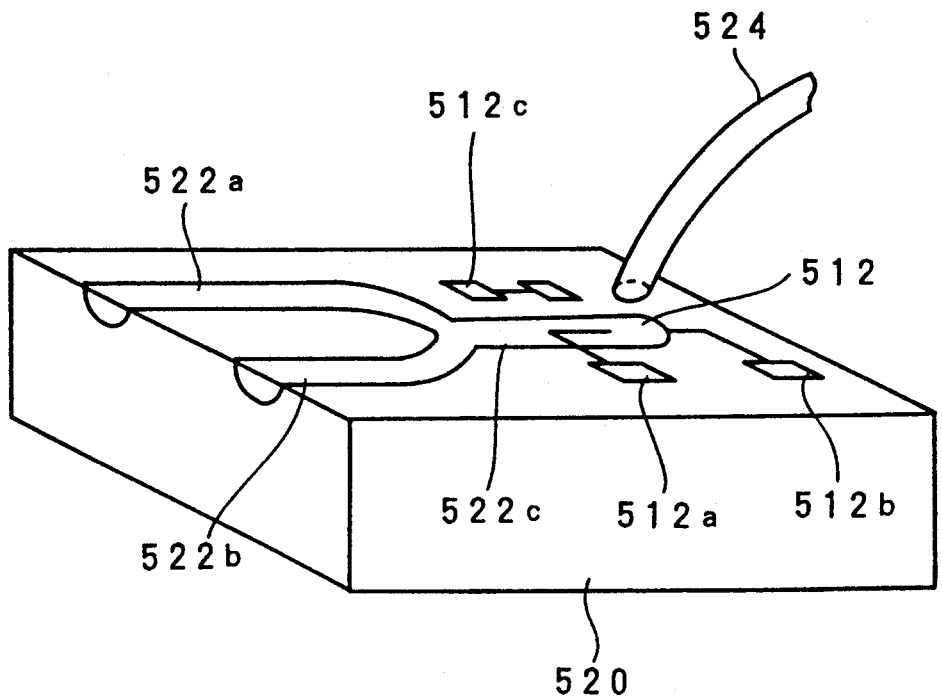
FIG. 27 shows a perspective view of a first embodiment of the photo-logic device.

FIG. 27 shows a specific first embodiment of the photo-logic device of the present invention. A lateral photo-sensing device 512 made of various compound semiconductor layers is formed on a semiconductor substrate 520, and an input electrode 512a, an output electrode 512b and a biasing electrode 512c are formed. On the left of the lateral photo-sensing device 512, a wave guide 522 is formed by flowing an appropriate compound semiconductor. A light pulse of a signal light thus applied to a first input port 522a of the wave guide 522 and a light pulse of a reference light is applied to the second input port 522b to attain a light switch by the same principle as that of the photo-logic device of FIG. 23. By integrating such light switches, a light switch which permits three-dimensional processing is provided. In this case, a fiber wave guide 524 having two optical fibers coupled thereto may be used instead of the wave guide 522. Further alternatively, the first input port 522a may be used as it is and the fiber wave guide 524 may be used in place of the second input port 522b.

Figure 28:
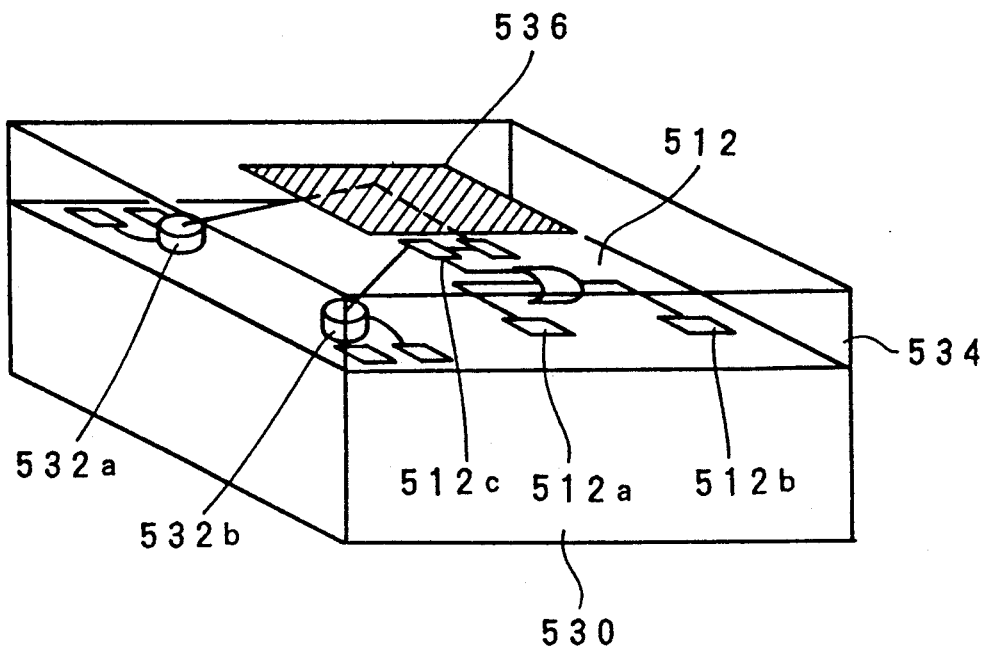
FIG. 28 shows a perspective view of a second embodiment of the photo-logic device.

FIG. 28 shows a second embodiment of the photo-logic device of the present invention. The same lateral photo-sensing device 512 as that of FIG. 27 is formed on the semiconductor substrate 530, and first and second light emitting devices (e.g. LD or LED) 532a and 532b are formed. A transparent layer or plate 534 made of resin or glass is formed above the lateral photo-sensing device 512 and the light emitting devices 532a and 532b, and a mirror 536 is formed thereon by vapor-depositing a metal. The mirror 536 directs the signal lights from the light emitting devices 532a and 532b to the lateral photo-sensing device 512. In such a photo-logic device, the light pulse of the signal light is emitted from the first light emitting device 532a and the light pulse of the reference light is emitted from the second light emitting device 532b so that the photo-logic is attained by the same principle as that of the photo-logic device of FIG. 23. Such photo-logic devices may be arranged in array. When they are three-dimensional integrated, a photo-logic circuit which permits three-dimensional processing is provided.

In accordance with the photo-logic device of the present invention, the photo-logic device can provide various functions to the signal lights applied to the lateral photo-sensing devices by properly setting the levels of the two or more signal lights applied to the lateral photo-sensing device through the optical guide means. As a result, a photo-logic device which is simple in structure, has a high efficiency and permits three-dimensional processing is provided.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:
1. A lateral photo-sensing device comprising;
   a first semiconductor layer of a first conductivity type formed on a semi-insulative semiconductor substrate;
   a second semiconductor layer of a second conductivity type formed on said first semiconductor layer for absorbing a light;
   a pair of electrodes formed on said second semiconductor layer, thereby forming a rectifying junction at an interface between said electrodes and said second semiconductor layer; and
   a biasing electrode for applying a biasing voltage to said first semiconductor layer.
2. A lateral photo-sensing device comprising;
   a first semiconductor layer of a first conductivity type formed on a semi-insulative semiconductor substrate;
   a second semiconductor layer of a second conductivity type formed on said first semiconductor layer for absorbing a light;
   a pair of Schottky type electrodes formed on said second semiconductor layer; and
   a biasing electrode for applying a biasing voltage to said first semiconductor layer.
3. A lateral photo-sensing device according to claim 1 wherein said first semiconductor layer is formed only in an area between a light absorbing area of said second semiconductor layer surrounded by a pair of Schottky type electrode and said semiconductor substrate.

4. A lateral photo-sensing device according to claim 2 wherein said first semiconductor layer is formed only in an area between a light absorbing area of said second semiconductor layer surrounded by said pair of Schottky type electrode and said semiconductor substrate.

5. An opt-electronic integrated circuit comprising:
a photo-conductive type lateral photo-sensing device including a first semiconductor layer of a first conductivity type formed on a semi-insulative semiconductor substrate, a second semiconductor layer of a second conductivity type formed on said first semiconductor layer for absorbing a light, a pair of electrodes formed on said second semiconductor layer, thereby forming a rectifying junction at an interface between said electrodes and said second semiconductor layer and a biasing electrode formed on said first semiconductor layer; and
a control circuit for applying a control signal to said biasing electrode in accordance with a detection signal from said lateral photo-sensing device to control an operation condition of said lateral photo-sensing device.

6. An opt-electronic integrated circuit according to claim 5, wherein said electrodes are Schottky type electrodes.

7. An opt-electronic integrated circuit according to claim 6 wherein a buffer layer is formed on said second semiconductor layer and said pair of Schottky type electrodes are formed on said buffer layer.

8. An opt-electronic integrated circuit according to claim 6 wherein said first semiconductor layer is formed only in an area between the light absorbing area of said second semiconductor layer surrounded by said pair of Schottky type electrodes and said semiconductor substrate.

9. An opt-electronic integrated circuit according to claim 5, wherein said control circuit includes a delay circuit for generating a delay signal in accordance with a detection signal from said lateral photo-sensing device and a high speed switching device for applying a control signal to said biasing electrode in response to said delay signal to control a responsivity of said lateral photo-sensing device.

10. An opt-electronic integrated circuit according to claim 9, wherein said delay circuit has a time constant matched to a signal band of a signal light to be applied to said lateral photo-sensing device.

11. An opt-electronic integrated circuit comprising:
a photo-conductive type lateral photo-sensing device including a first semiconductor layer of a first conductivity type formed on a semi-insulative semiconductor substrate, a second semiconductor layer of a second conductivity type formed on said first semiconductor layer for absorbing a light, a pair of electrodes formed on said second semi-conductor layer, and a biasing electrode formed on said first semiconductor layer; and
a control circuit for varying a bias voltage to be applied to said biasing electrode in accordance with a level of a detection signal from said lateral photo-sensing device.

12. An opt-electronic integrated circuit according to claim 11, wherein said first semiconductor layer is formed only in an area between the light absorbing area of said second semiconductor layer surrounded by said pair of electrodes and said semiconductor substrate.

13. An opt-electronic integrated circuit comprising:
a photo-conductive type lateral photo-sensing device including a first semiconductor layer of a first conductivity type formed on a semi-insulative semiconductor substrate, a second semiconductor layer of a second conductivity type formed on said first semiconductor layer for absorbing a light, a pair of electrodes formed on said second semi-conductor layer, and a biasing electrode formed on said first semiconductor layer; and
a control circuit for varying a bias voltage to be applied to said biasing electrode in accordance with a level of detection signal from said lateral photo-sensing device said control circuit detecting an average level of the detection signal supplied from said lateral photosensing device and applying a bias voltage corresponding to the average level to said biasing electrode.

14. A photo-logic device comprising:
a photo-conductive type lateral photo-sensing device including a first semiconductor layer of a first conductivity type formed on a semi-insulative semiconductor substrate, a second semiconductor layer of a second conductivity type formed on said first semiconductor layer for absorbing a light, a pair of electrodes formed on said second semiconductor layer, thereby forming a rectifying junction at an interface between said electrodes and said second semiconductor layer and a biasing electrode formed on said first semiconductor layer; and
optical guide means for guiding at least two signal lights to said second semiconductor layer.

15. An photo-logic device according to claim 14, wherein said electrodes are Schottky type electrodes.

16. A photo-logic device according to claim 14, wherein said semi-insulative semiconductor substrate is provided with an optical wave guide to form said optical guide means.

* * * * *